(12) United States Patent
Nakazawa et al.

(10) Patent No.: US 8,809,130 B2
(45) Date of Patent: Aug. 19, 2014

(54) REVERSE BLOCK-TYPE INSULATED GATE BIPOLAR TRANSISTOR MANUFACTURING METHOD

(71) Applicant: Fuji Electric Co., Ltd., Kawasaki (JP)

(72) Inventors: Haruo Nakazawa, Nagano (JP); Motoyoshi Kubouchi, Nagano (JP); Hideaki Teranishi, Tokyo (JP); Hideo Shimizu, Tokyo (JP)

(73) Assignee: Fuji Electric Co., Ltd., Kawasaki (JP)

(*) Notice: Subject to any disclaimer, the term of this patent is extended or adjusted under 35 U.S.C. 154(b) by 0 days.

(21) Appl. No.: 13/911,685

(22) Filed: Jun. 6, 2013

(65) Prior Publication Data

US 2013/0344663 A1    Dec. 26, 2013

Related U.S. Application Data

(62) Division of application No. 13/024,715, filed on Feb. 10, 2011, now Pat. No. 8,460,975.

(30) Foreign Application Priority Data

Feb. 12, 2010  (JP) .................................. 2010-028738
Aug. 19, 2010  (JP) .................................. 2010-183847

(51) Int. Cl.
    *H01L 21/00*    (2006.01)
(52) U.S. Cl.
    USPC .................................. 438/135; 257/E21.382
(58) Field of Classification Search
    USPC .......................... 438/133–140; 257/E21.382
    See application file for complete search history.

(56) References Cited

U.S. PATENT DOCUMENTS

| | | | |
|---|---|---|---|
| 4,904,609 A | 2/1990 | Temple | |
| 6,482,681 B1 * | 11/2002 | Francis et al. | 438/138 |
| 7,534,666 B2 * | 5/2009 | Francis et al. | 438/137 |
| 2005/0062107 A1 | 3/2005 | Takayuki et al. | |
| 2006/0038206 A1 | 2/2006 | Shimoyama et al. | |
| 2006/0249797 A1 | 11/2006 | Nakazawa et al. | 257/378 |

(Continued)

FOREIGN PATENT DOCUMENTS

| | | |
|---|---|---|
| CN | 1591776 | 3/2005 |
| JP | 2-22869 | 1/1990 |

(Continued)

OTHER PUBLICATIONS

Restriction Requirement mailed from the Unites States Patent and Trademark Office on Feb. 13, 2012 in the related U.S. Appl. No. 13/024,715.

(Continued)

*Primary Examiner* — Richard Booth

(57) ABSTRACT

A reverse block-type insulated gate bipolar transistor (IGBT) manufacturing method that, when manufacturing a reverse block-type IGBT having a separation layer formed along tapered surfaces of a V-shaped groove formed using anisotropic etching, can secure a highly reliable reverse pressure resistance, and suppress a leakage current when reverse biasing. When irradiating with a flash lamp for flash lamp annealing after implantation of ions into a second conductivity type separation layer and second conductivity type collector layer to form the second conductivity type collector layer and second conductivity type separation layer, the strongest portion of radiation energy is focused on a depth position from the upper portion to the central portion of a tapered side edge surface.

8 Claims, 25 Drawing Sheets

(56) References Cited

U.S. PATENT DOCUMENTS

| | | | |
|---|---|---|---|
| 2008/0227277 A1 | 9/2008 | Nakazawa | 438/550 |
| 2008/0268660 A1 | 10/2008 | Itani et al. | |
| 2011/0108883 A1 | 5/2011 | Tsukamoto et al. | |

FOREIGN PATENT DOCUMENTS

| | | |
|---|---|---|
| JP | 2001-185727 | 7/2001 |
| JP | 2002-76017 | 3/2002 |
| JP | 2004-336008 | 11/2004 |
| JP | 2005-72045 | 3/2005 |
| JP | 2005-223301 | 8/2005 |
| JP | 2006-156926 | 6/2006 |
| JP | 2006-303410 | 11/2006 |
| JP | 2008-294397 | 12/2008 |
| WO | 2009/139417 | 11/2009 |

OTHER PUBLICATIONS

Office Action mailed from the Unites States Patent and Trademark Office on Jul. 13, 2012 in the related U.S. Appl. No. 13/024,715.

Notice of Allowance mailed from the Unites States Patent and Trademark Office on Feb. 14, 2013 in the related U.S. Appl. No. 13/024,715.

U.S. Appl. No. 13/024,715, filed Feb. 10, 2011, Haruo Nakazawa et al., Fuji Electric Co., Ltd.

Partial Translation of Japanese Office Action mailed Nov. 26, 2013 in corresponding Japanese Application No. 2010-183847.

Office Action dated Apr. 22, 2014 in corresponding Chinese Patent Application No. 201110033243.1.

Office Action dated Mar. 25, 2014 in corresponding Japanese Patent Application No. 2010-183847.

* cited by examiner

REVERSE BLOCK-TYPE INSULATED GATE BIPOLAR TRANSISTOR MANUFACTURING METHOD

CROSS-REFERENCE TO RELATED APPLICATIONS

This application is a U.S. divisional application filed under 37 C.F.R. 1.53(b) claiming priority benefit of U.S. application Ser. No. 13/024,715, filed Feb. 10, 2011, issued on Jun. 11, 2013 as U.S. Pat. No. 8,460,975. This application claims foreign priority benefit under 35 U.S.C. §119 from Japanese Patent Application Nos. 2010-028738 and 2010-183847 filed on Feb. 12, 2010 and Aug. 19, 2010, respectively, in the Japanese Intellectual Property Office, the entire disclosures of which are incorporated herein by reference.

BACKGROUND

1. Field

The present invention relates to an improvement of a reverse block-type insulated gate-type bipolar transistor (hereafter abbreviated to IGBT) manufacturing method that allows an IGBT, with which it is normally common to secure reliability only for forward blocking voltage capability, to maintain reliability for reverse blocking voltage capability equivalent to that of the forward blocking voltage capability.

2. Description of the Related Art

A reverse block-type IGBT is a semiconductor device that allows an IGBT, normally and commonly used in a circuit in which it is sufficient to secure reliability only for forward blocking voltage capability, to maintain reliability for reverse blocking voltage capability equivalent to that of the forward blocking voltage capability.

Normally, in a power converting device such as an inverter circuit or chopper circuit using a semiconductor device, a normal IGBT designed in such a way that reliability of only forward blocking voltage capability is secured has been used as a switching element, as it is used with a direct current power source. However, consideration is being given to a matrix converter such as a direct link type converter circuit that uses a bidirectional switching element, being an AC (alternating current)/AC conversion, an AC/DC (direct current) conversion, or a DC/AC conversion, and has a better power conversion efficiency. In this case, when configuring the bidirectional switching element with an inverse-parallel connection of the normal IGBT, it becomes necessary to connect diodes for blocking a reverse voltage in series with the IGBT, the cost increases commensurately, and the external form becomes larger. Therefore, to make the bidirectional switching element less costly and more compact, there has been a demand for a reverse block-type IGBT that can eliminate reverse voltage blocking diodes by adopting a structure that provides reverse blocking voltage capability, which previously had not been considered for the normal IGBT, with reliability equivalent to that of the forward blocking voltage capability.

With the normal IGBT, as a flat, reverse pressure resistance p-n junction between a p-type collector layer and an n-drift layer on the rear surface side of a semiconductor substrate is left exposed in a semiconductor chip side edge surface, which is a cutting surface when the semiconductor substrate is cut and made into semiconductor chips, it does not have reliability as a reverse block. In the reverse block-type IGBT, in order to secure reverse block voltage capability, the flat, reverse pressure resistance p-n junction is configured such that it is bent so as not to be cut and exposed, and extended to the front surface side of the semiconductor chip. Furthermore, its jointing end is protected by a front surface insulating film, and reliability is secured. In order to cause the flat, reverse pressure resistance p-n junction to bend to the front surface side, there is a need for a p-type diffusion layer, which is a p-type diffusion layer of the same conductivity type as the p-type collector layer, formed on the semiconductor chip side edge surface from the rear surface (the p-type collector layer side) to the front surface of the semiconductor chip. The p-type diffusion layer is a separation layer. The invention relates to a manufacturing method whereby the separation layer is formed.

FIGS. 2A to 2C are main portion sectional views of a semiconductor substrate (which may hereafter be referred to as a wafer) showing in step order one manufacturing method whereby a separation layer in a previously known reverse block-type IGBT is formed. FIGS. 2A to 2C show a method of forming the separation layer using a coating diffusion. First, a dopant mask oxide film 2 with a thickness of around 2.5 μm is formed on a wafer 1 using a thermal oxidation method (FIG. 2A). Next, an aperture 3 for causing boron, a p-type impurity source, to diffuse is formed on the oxide film using patterning and etching (a photolithography technique) (FIG. 2B). Next, a boron source 5 is applied over the aperture 3, after which a high temperature, long-time heating process is carried out using a diffusion furnace, and a p-type diffusion layer with a depth of around a few hundred micrometers is formed (FIG. 2C). The p-type diffusion layer becomes a separation layer 4. Subsequently, as shown in FIG. 3, which is a reverse block-type IGBT completion diagram, after a front surface side MOS structure 10 is formed, the wafer is made thinner by grinding from the rear surface side until reaching the vicinity of the leading edge of the separation layer 4 (the broken line of FIG. 2C). A rear surface structure configured of a p-type collector layer 6 and a collector electrode 7 is formed on the ground surface (FIG. 3). By cutting the wafer along a scribe line positioned on a central line of a surface pattern of the separation layer 4, the reverse block-type IGBT chip shown in the FIG. 3 sectional view of a vicinity of a cutting end portion 8 is obtained.

FIGS. 4A to 4C are main portion sectional views of a wafer showing in step order another manufacturing method whereby the separation layer 4 in the previously known reverse block-type IGBT is formed. FIGS. 4A to 4C are main portion sectional views of a semiconductor substrate showing in order steps of forming a separation layer 4a having the same function as the separation layer 4 by forming a diffusion layer along approximately perpendicular side edge surfaces of a trench (groove) 11 dug perpendicularly from the front surface in the wafer 1.

First, a trench formation etching mask is formed with the oxide film 2 of a thickness of a few micrometers (FIG. 4A). Next, the trench 11 of a depth of around a few hundred micrometers is formed by dry etching (FIG. 4B). Next, an impurity (boron) is introduced to the side walls of the trench 11 using vapor-phase diffusion, forming the p-type separation layer 4a (FIG. 4C). The inside of the trench is filled with an insulating film and a reinforcement material such as polysilicon, and the front surface side MOS structure 10, rear surface collector layer 6, and collector electrode 7 necessary for the rear surface grinding and IGBT are formed. Next, by cutting the IGBT chip off from the wafer 1 by dicing along a scribe line positioned in the center of the trench 11, or between two trenches not shown, the reverse block-type IGBT shown in the FIG. 5 sectional view of the vicinity of the cutting end portion 8 is obtained (JP-A-2-22869, JP-A-2001-185727, and JP-A-2002-76017).

With the method of forming the separation layer of the reverse block-type IGBT shown in FIGS. 2A-2C using coating diffusion, in order to apply the boron source (a liquid boron diffusion source) from the front surface, to cause the boron to diffuse, and to form the p-type separation layer with a diffusion depth of around a few hundred micrometers, a high temperature, long-time thermal diffusion process is necessary. As a result, a depreciation of quartz fixtures such as a quartz board, quartz tube, and quartz nozzle configuring the diffusion furnace, contamination from a heater, a reduction in strength due to a quartz fitting devitrification phenomenon, and the like, are liable to occur more frequently, and the manufacturing cost increases. Also, in the coating diffusion method of forming the separation layer, a thick oxide film of good quality must be used in order that the mask oxide film can tolerate a long-time boron diffusion, and that there is no penetration of the oxide film by the boron. As a method of obtaining a mask which is highly durable in this way, that is, a good-quality silicon oxide film, a thermal oxidation method is known.

When forming the p-type separation layer using high temperature, long-time (for example, 1,300° C., 200 hours) boron diffusion in this way, a thermally oxidized film with a thickness of approximately 2.5 µm is necessary for effective durability of the mask oxide. For the formation of a thermally oxidized film with a thickness of 2.5 µm, the oxidation time needed at an oxidizing temperature of 1,150° C., for example, is approximately 200 hours for a dry (a dry oxygen atmosphere) oxidation with which a good-quality oxide film can be obtained. Furthermore, as a large amount of oxygen is introduced to the inside of the wafer during the oxidation processes, crystal defects such as oxygen precipitates and oxidation-induced stacking faults occur, and problems of device characteristic depreciation and reduction in reliability also occur due to the occurrence of an oxygen donor phenomenon.

Furthermore, with the diffusion after the boron source application, because a high temperature, long-time diffusion process is normally carried out in an oxidizing atmosphere, interstitial oxygen is introduced to the inside of the wafer. As a result, crystal defects such as oxygen precipitates, the oxygen donor phenomenon, oxidation-induced stacking faults (OSF), and slip dislocation also occur in this diffusion process. It is known that the leakage current increases at a p-n junction formed in the vicinity of these crystal defects, and the pressure resistance and reliability of a thermally oxide film formed in the vicinity of the crystal defects of the wafer depreciate considerably. Also, the oxygen taken into the wafer during the diffusion may become a donor, causing a problem wherein the pressure resistance decreases. Also, with the separation layer formation method using the coating diffusion as shown in FIGS. 2A to 2C, the boron diffusion proceeds from the aperture of the mask oxide film approximately isotropically up, down, left, and right in the silicon bulk. As a result, when carrying out boron diffusion of 200 µm in the depth direction, the boron simultaneously diffuses and spreads 160 µm in a sideways direction too, forming an obstacle to the problem of reducing the chip size.

With the separation layer formation method utilizing the trench shown in FIGS. 4A to 4C, a trench is formed by dry etching, and boron is introduced to the side walls of the formed trench, thereby forming the p-type separation layer. Subsequently, the trench is filled with an insulating film and a reinforcement material such as polysilicon. As the p-type separation layer shown in FIG. 4 formed in this way can utilize a narrow trench with a high aspect ratio, it is more advantageous with relation to the contraction of a device pitch than the p-type separation layer using the thermal diffusion of FIGS. 2A to 2C. However, the processing time needed for etching to a depth of around 200 µm when using a typical dry etching device is around 100 minutes per wafer, which presents other problems such as an increase in lead time, and an increase in maintenance frequency. Also, when using a silicon oxide ($SiO_2$) film as a mask when forming a deep trench using a dry etching, the selectivity is 50 or less, meaning that a thick silicon oxide film of around a few micrometers is necessary. As a result, new problems occur in that there is an increase in cost and a reduction in yield rate due to the introduction of process-induced crystal defects such as oxidation-induced stacking faults and oxygen precipitates. Furthermore, with the separation layer formation process using dry etching and utilizing a trench with a high aspect ratio, a chemical residue 12, a resist residue 13, or the like, is likely to occur inside the trench 11, as shown in FIG. 6, which causes problems of a yield reduction, decreased reliability, and the like.

Normally, when introducing a dopant such as phosphorus or boron to the side walls of the trench 11, as the side walls of the trench 11 are perpendicular, the introduction of the dopant to the side walls of the trench 11 is carried out by implanting ions with the wafer inclined. However, the introduction of a dopant to the side walls of a trench with a high aspect ratio causes adverse effects such as an effective dose reduction, an accompanying increase in implantation time, an effective projection range reduction, a dose loss due to a screen oxide film, and a reduction in implantation uniformity. As a method for introducing impurities into the trench 11 with a high aspect ratio in order to combat this problem, a vapor-phase diffusion method may be used whereby the wafer is exposed to a gasified dopant atmosphere such as phosphine ($PH_3$) or diborane ($B_2H_6$) instead of the ion implantation, but this is inferior to the ion implantation method with regard to precision controllability of the dose. Also, although a step of filling the trench 11 with a high aspect ratio with an insulating film or polysilicon is necessary in order to increase the wafer strength, a space called a void may form inside the trench, and reduced reliability or similar problems occur.

A method of solving the above kinds of problem has been proposed. It is a method whereby, by implanting ions and annealing along tapered surfaces (side edge surfaces) formed by etching V-shaped grooves in the wafer in a latticed pattern in each rectangular, flat chip region, a separation layer 4b is formed on the side edge surfaces of the chip region, as in the trapezoid wafer sectional view shown in FIGS. 7A and 7B. The tapered surfaces formed on the four side edge surfaces of each of the kind of rectangular chip region shown in FIG. 7A can be fabricated by forming a V-shaped groove from either one of the main surfaces of the wafer with a selective anisotropic etching using an alkaline etching solution (JP-A-2006-156926, JP-A-2004-336008, and JP-A-2006-303410). Furthermore, a reverse block-type IGBT having the tapered side edge surfaces shown in FIG. 7B, having tapered surfaces with an inclination reverse of that of the tapered surfaces shown in FIG. 7A, can utilize an emitter side (the upper side of the diagram in FIGS. 7A and 7B) surface more widely than the reverse block-type IGBT shown in FIG. 7A can utilize. Because of this, as an area that can be utilized for an n-type emitter region 15 and p-type base region 16 formed on the emitter side surface layer increases, there is an advantage in that it is possible to increase the current density, and it is possible to reduce the chip area with respect to the same current rating. Also, it is possible, with the reverse block-type IGBT having the tapered surfaces, to form the separation layer 4b using ion implantation and annealing in a far shorter processing time than that of the high temperature, long-time diffusion. Therefore, it is possible to solve the problem of defects caused by crystal defects and oxygen associated with the separation layer 4b formation method using the long-time, high temperature diffusion, and to solve the problem of diffusion furnace damage. Furthermore, as the aspect ratio is lower than with the manufacturing method using the perpendicular trench digging, there is no void or residue, which is a problem when filling the trench with the insulating film, and the dopant can be easily introduced when implanting the ions.

As disclosed in JP-A-2006-156926, JP-A-2004-336008, and JP-A-2006-303410, with the reverse block-type IGBT having a separation layer formed along the tapered surfaces of the V-shaped groove formed by an anisotropic etching, it is possible to avoid the long-time diffusion accompanied by the various previously described adverse effects. However, as the depth of the impurity distribution of the separation layer formed is small, if crystal defects formed accompanying the ion implantation are insufficiently restored even by an activation process and the defects remain, the leakage current when reverse biasing is likely to increase because the crystal defects are near the p-n junction, and it becomes difficult to maintain the reverse pressure resistance. Also, when employing a laser annealing process as a method for a crystal defect recovery process, as it is a short (a few tens of nanoseconds to a few microseconds) laser irradiation and the focal position of the laser irradiation differs between the wafer front surface and side edge surface separation layer, it is known that displacement of the focal point can occur, that the activation of the side edge surface separation layer is likely to be insufficient, and that the crystal defects cannot be sufficiently restored. Furthermore, when carrying out laser annealing, as the laser irradiation regions are small, it is necessary to scan with the laser and irradiate in such a way as to connect the small irradiation regions in a plane, covering the whole of the ion implantation layer, in order to activate sufficiently. At this time, an irradiation mark may be formed during the scan, causing an adverse effect on the pressure resistance characteristics.

SUMMARY

The invention, having been contrived bearing in mind the previously described problems, has an object of providing a reverse block-type insulated gate bipolar transistor manufacturing method that, when manufacturing a reverse block-type IGBT having a separation layer formed along tapered surfaces of a V-shaped groove formed using anisotropic etching, can secure a highly reliable reverse pressure resistance, and suppress a leakage current when reverse biasing.

To achieve the object, a reverse block-type insulated gate bipolar transistor manufacturing method according to one aspect of the invention includes: forming a MOS gate structure on one main surface of a first conductivity type semiconductor substrate; forming a second conductivity type collector layer on the other main surface; forming a second conductivity type separation layer, along a tapered side edge surface formed by etching from either one of the main surfaces to the other main surface, that links the two main surfaces with a layer of the same conductivity type, and is connected to the second conductivity type collector layer of the other main surface; and forming each of an emitter metal electrode on the MOS gate structure side and a collector metal electrode on the second conductivity type collector layer side, wherein, when irradiating with a flash lamp for a flash lamp annealing after an implantation of ions into the second conductivity type separation layer and second conductivity type collector layer to form the second conductivity type collector layer and second conductivity type separation layer, the strongest portion of the radiation energy is focused on a depth position from the upper portion to the central portion of the tapered side edge surface.

It is preferable that the flash lamp radiation energy density for the flash lamp annealing is a high density of an extent at which the second conductivity type collector layer is not thermally destroyed. Also, it is preferable that the flash lamp annealing is carried out separately for the second conductivity type separation layer and second conductivity type collector layer. It is preferable that the flash lamp annealing is carried out while a holding temperature of the semiconductor substrate is maintained at a high temperature equal to or lower than the melting temperature of the emitter metal electrode. Also, it is desirable that the emitter metal electrode is a metal electrode film with aluminum as a main element. Also, it is better that the holding temperature of the semiconductor substrate is a high temperature of 500° C. or less. Furthermore, it is desirable that the light source of the flash lamp annealing is a xenon lamp having an energy density of 20 J/cm$^2$ to 40 J/cm$^2$ every few milliseconds. Furthermore, it is also possible that the light source of the flash lamp annealing is an infrared lamp or halogen lamp having an energy density of 20 J/cm$^2$ to 40 J/cm$^2$.

Also, the object of the invention can be achieved by a reverse block-type insulated gate bipolar transistor manufacturing method according to another aspect of the invention including forming a MOS gate structure on one main surface of a first conductivity type semiconductor substrate; forming a second conductivity type collector layer on the other main surface; forming a second conductivity type separation layer, along a tapered side edge surface formed by etching from either one of the main surfaces to the other main surface, that links the two main surfaces with a layer of the same conductivity type, and is connected to the second conductivity type collector layer of the other main surface; and forming each of an emitter metal electrode on the MOS gate structure side and a collector metal electrode on the second conductivity type collector layer side, wherein, when irradiating with a laser for a laser annealing after an implantation of ions into the second conductivity type separation layer and second conductivity type collector layer to form the second conductivity type collector layer and second conductivity type separation layer, the focal point is adjusted to a depth position from the upper portion to the central portion of the tapered side edge surface.

It is preferable that the laser radiation energy density for the laser annealing is a high density of an extent at which the second conductivity type collector layer is not thermally destroyed. Also, it is preferable that the laser annealing is carried out separately for the second conductivity type separation layer and second conductivity type collector layer. Furthermore, it is preferable that the laser annealing is a method that increases the laser radiation energy density by utilizing light reflected from the tapered side edge surface and side edge surface bottom portion.

It is also desirable that an overlap rate at a time of a laser irradiation is increased to an extent at which the second conductivity type collector layer is not destroyed by heat. Furthermore, the laser annealing may be carried out while the holding temperature of the semiconductor substrate is maintained at a high temperature equal to or less than the melting temperature of the emitter metal electrode. Furthermore, it is preferable that the emitter metal electrode is a metal electrode film with aluminum as a main element. It is desirable that the holding temperature of the semiconductor substrate is a high temperature of 500° C. or less.

According to the aspects of the invention, it is possible to provide a reverse block-type insulated gate bipolar transistor manufacturing method that, when manufacturing a reverse block-type IGBT having a separation layer formed along tapered surfaces of a V-shaped groove formed using anisotropic etching, can secure a highly reliable reverse pressure resistance, and suppress a leakage current when reverse biasing.

DESCRIPTION OF EMBODIMENTS

Figure 1:
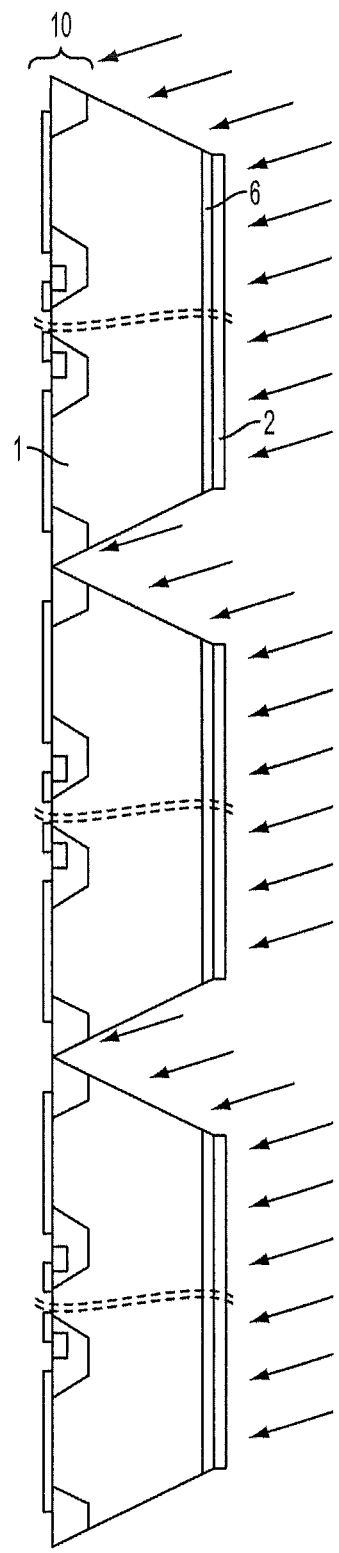
FIG. 1 is a semiconductor substrate sectional view showing a direction in which ions are implanted to form a separation layer on tapered surfaces according to embodiments of the invention.
Figure 2A:
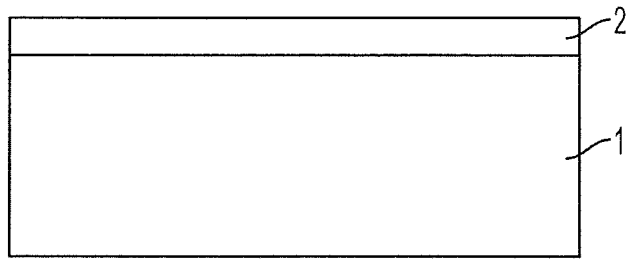
FIGS. 2A to 2C are main portion sectional views of a semiconductor substrate showing a separation layer formation method using a previously known coating diffusion.
Figure 2B:
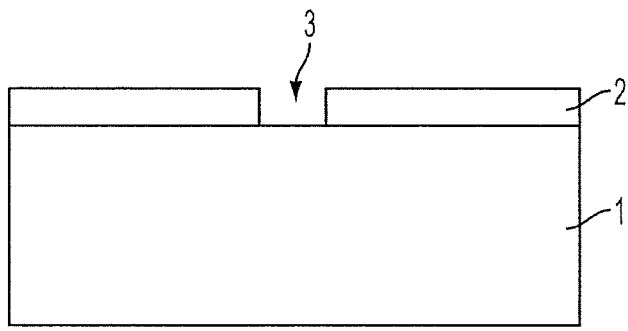
Figure 2C:
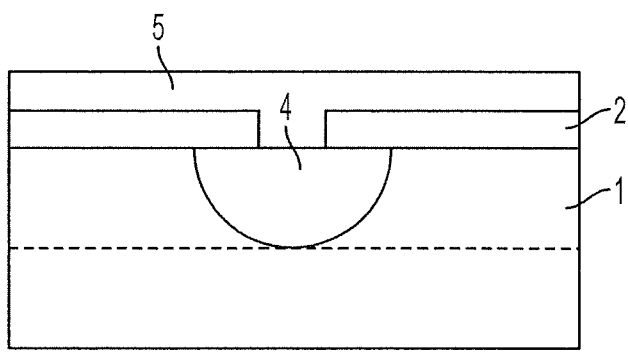
Figure 3:
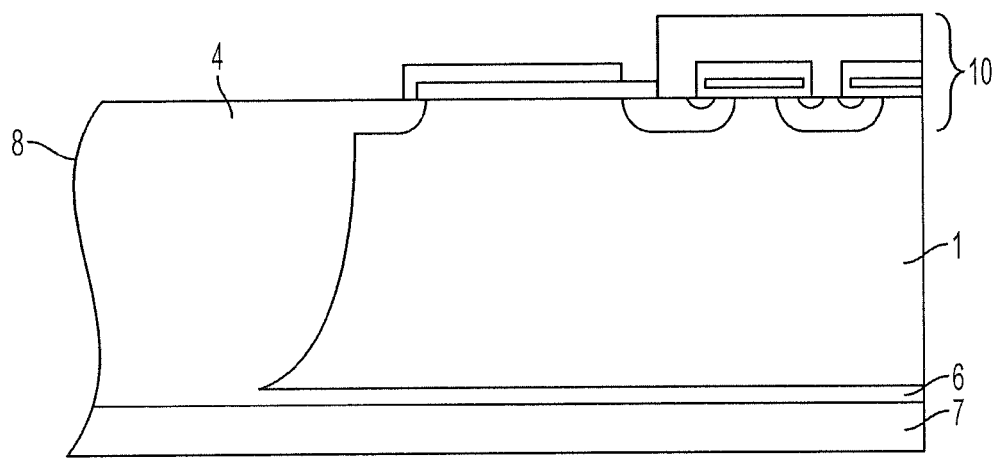
FIG. 3 is a sectional view of an end portion vicinity of a reverse block-type IGBT having a separation layer formed using the previously known coating diffusion.
Figure 4A:
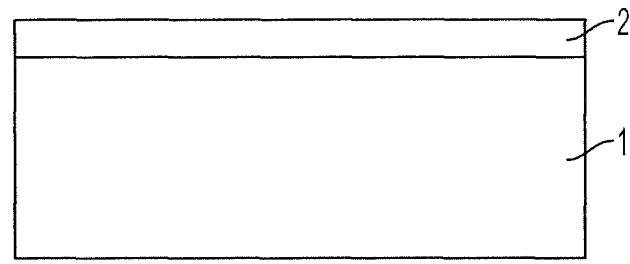
FIGS. 4A to 4C are main portion sectional views of a semiconductor substrate showing a separation layer formation method utilizing a previously known trench.
Figure 4B:
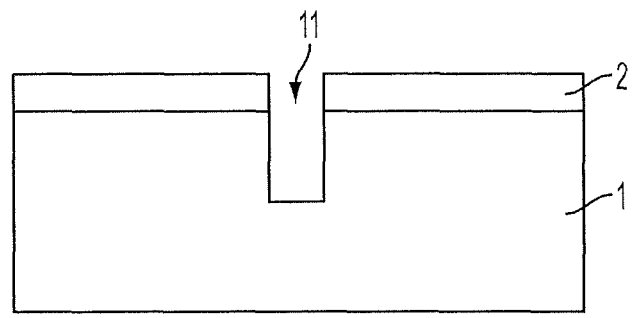
Figure 4C:
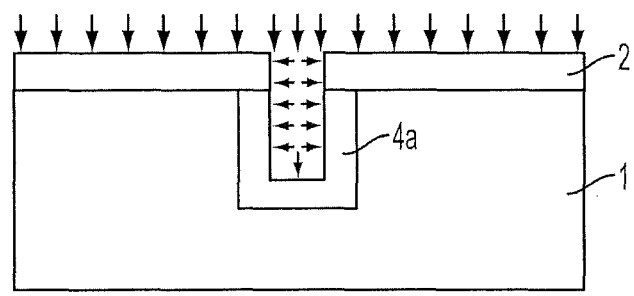
Figure 5:
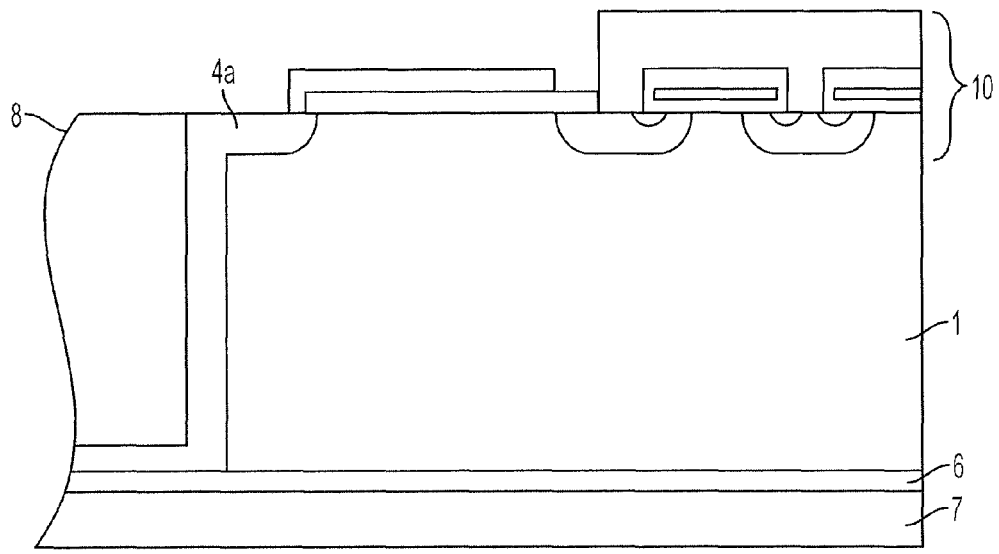
FIG. 5 is a sectional view of an end portion vicinity of a reverse block-type IGBT having a separation layer utilizing the previously known trench.
Figure 6:
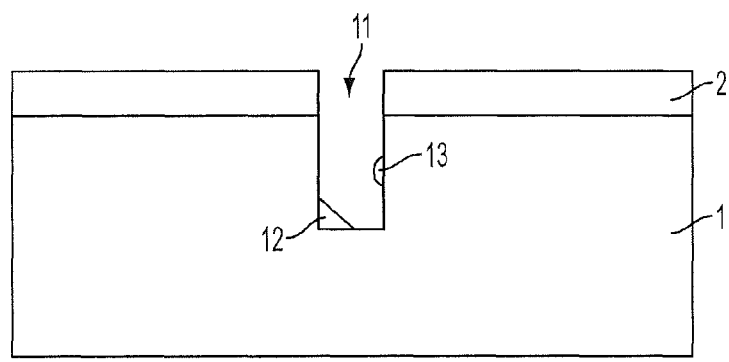
FIG. 6 is a sectional view of an end portion vicinity showing problem areas of the reverse block-type IGBT having the separation layer utilizing the previously known trench.

Hereafter, a detailed description will be given, referring to the drawings, of embodiments relating to a manufacturing method of a reverse block insulated gate bipolar transistor of the invention. The invention is not limited to the details of the embodiments to be described hereafter, provided that the scope of the invention is not exceeded. In the following descriptions, an n-type is used as a first conductivity type and a p-type as a second conductivity type, but this may be reversed. Also, one main surface is taken to be an IGBT emitter side or front surface, and the other main surface to be an IGBT collector side or rear surface.

First Embodiment

Hereafter, a description will be given of a first embodiment relating to a manufacturing method of a reverse block-type IGBT. The first embodiment relates to a manufacturing method whereby a xenon flash lamp annealing is used in place of a previously known laser annealing in an activation after an implantation of boron ions into a rear surface and tapered side edge surfaces of a wafer. Also, in the first embodiment, the description will be given centered on a manufacturing method of an n-type reverse block-type IGBT having tapered surfaces (side edge surfaces) (hereafter abbreviated as collector side aperture taper or, in the reverse case, abbreviated as emitter side aperture taper) configured by a V-shaped groove formed oriented in such a way that the emitter side front surface is wide and the collector side rear surface is narrow, as shown in the sectional view of FIG. 7B.

Figure 7A:
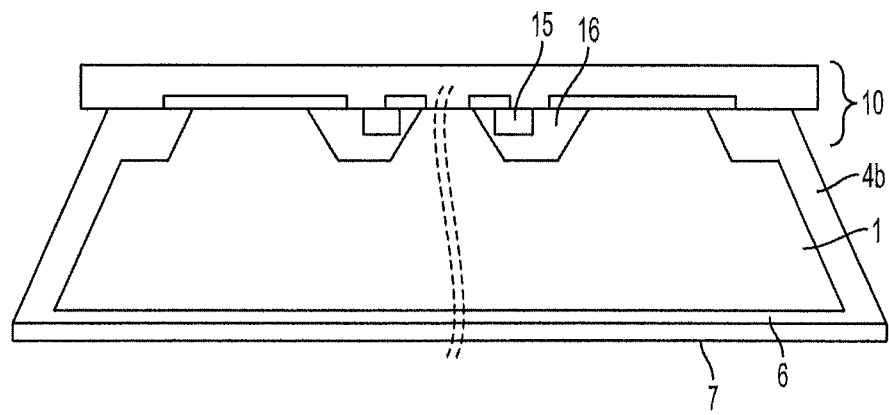
FIGS. 7A and 7B are sectional views of a reverse block-type IGBT having a separation layer on tapered surfaces utilizing an anisotropic etching.
Figure 7B:
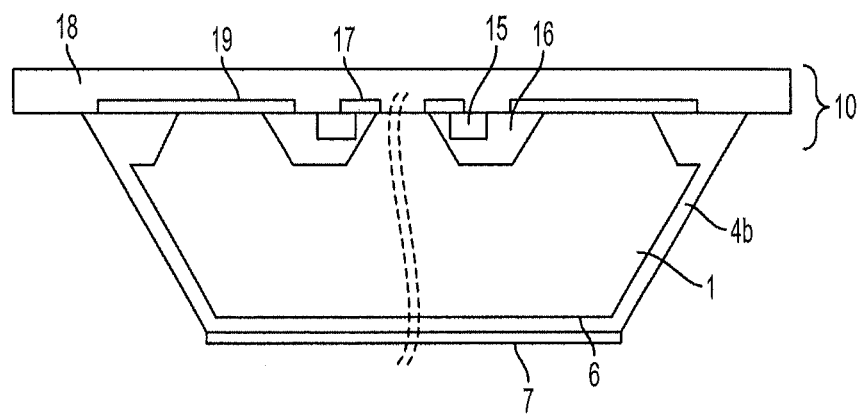
Figure 27:
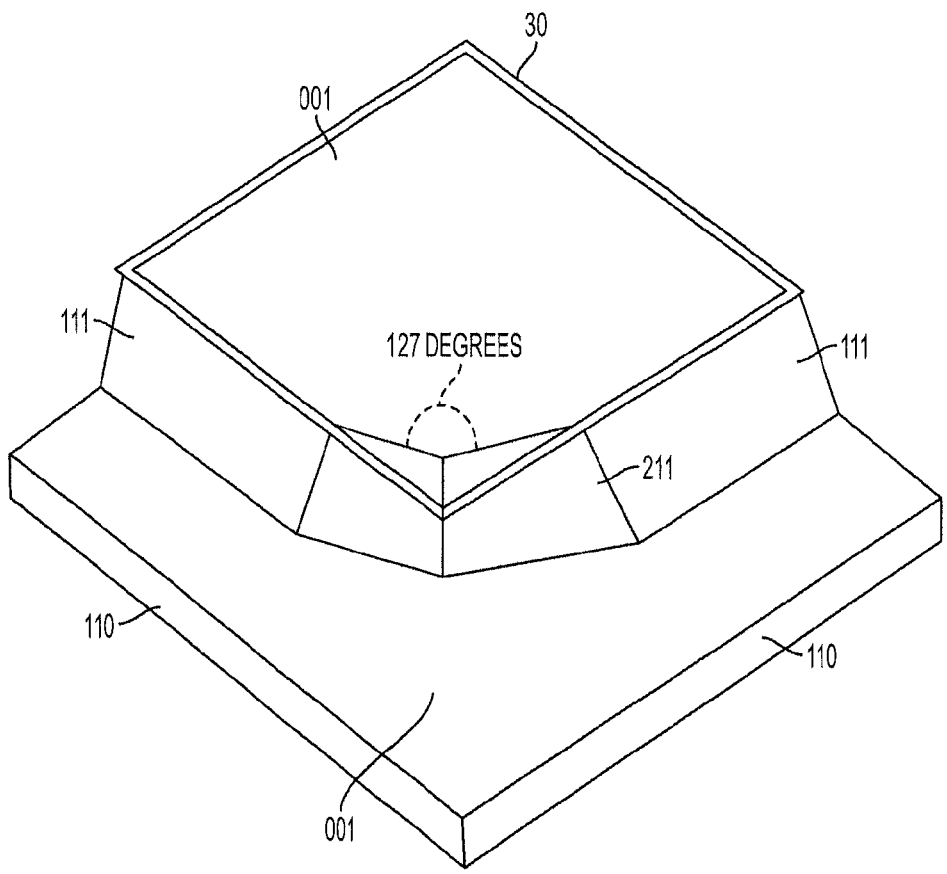
FIG. 27 is a partial perspective view of a semiconductor substrate showing side edge surfaces of the V-shaped groove formed by the anisotropic etching and a plane direction thereof, according to the invention.

The reverse block-type IGBT having this kind of collector side aperture taper (FIG. 7B) is processed by means of an anisotropic etching using a well-known alkaline etching solution (a KOH aqueous solution, or the like), with an insulating film 30 as a mask, from a collector layer 6 side of the rear surface side of a wafer 1 having an 001 surface as a main surface into the kind of shape shown in the partial perspective view of FIG. 27 having four tapered surfaces with 111' surfaces as principal plane directions. As the anisotropic etching is carried out in a latter stage of the process after the surface IGBT structure is formed, and a passivation layer is formed in the surface IGBT structure, there is little risk of contaminants being incorporated, and it is possible to shorten the etching time using the KOH aqueous solution. The tapered surfaces formed by the anisotropic etching are a portion configuring four mutually orthogonal principal side edge surfaces on the periphery of a front surface side MOS gate structure 10 when manufacturing a rectangular silicon semiconductor chip formed of the reverse block-type IGBT according to embodiments of the invention (FIG. 7B). By using a wet anisotropic etching, it is also possible to cause the etching to stop automatically simply by setting the width of a mask aperture portion and, even in the event that the etching time fluctuates, the depth of the V-shaped groove does not fluctuate. The reverse block-type IGBT includes an n-type emitter region 15, a p-type base region 16, a gate insulating film (not shown), a gate electrode 17 on the gate insulating film, and the like, as the MOS gate structure, as shown in FIG. 7B. Furthermore, the reverse block-type IGBT has an emitter electrode 18 deposited on the gate electrode 17 across an interlayer insulating film (not shown) and in contact with the surfaces of the n-type emitter region 15 and p-type base region 16, a thick insulating film 19 on a pressure-resistant structure portion positioned on the periphery of the MOS gate structure 10, and the like. Furthermore, the reverse block-type IGBT is configured to have the p-type collector layer 6 and a collector electrode 7 on the rear surface side.

Prior to the anisotropic etching from the rear surface side of the wafer 1, using the wafer 1 having the 001 surface as the main surface and a 110 direction as an orientation flat, an oxide mask pattern is formed by photolithography in such a way as to repetitively dispose a plurality of device patterns divided into a lattice form inside the wafer, utilizing the orientation flat as a reference line. Subsequently, the collector side aperture taper having the 111 surface and equivalent 111' surfaces as the four principal side edge surfaces and, incidentally, the kind of 211' surfaces shown in the perspective view of FIG. 27 are formed simultaneously by means of the anisotropic etching.

Figures 8A, 8B:
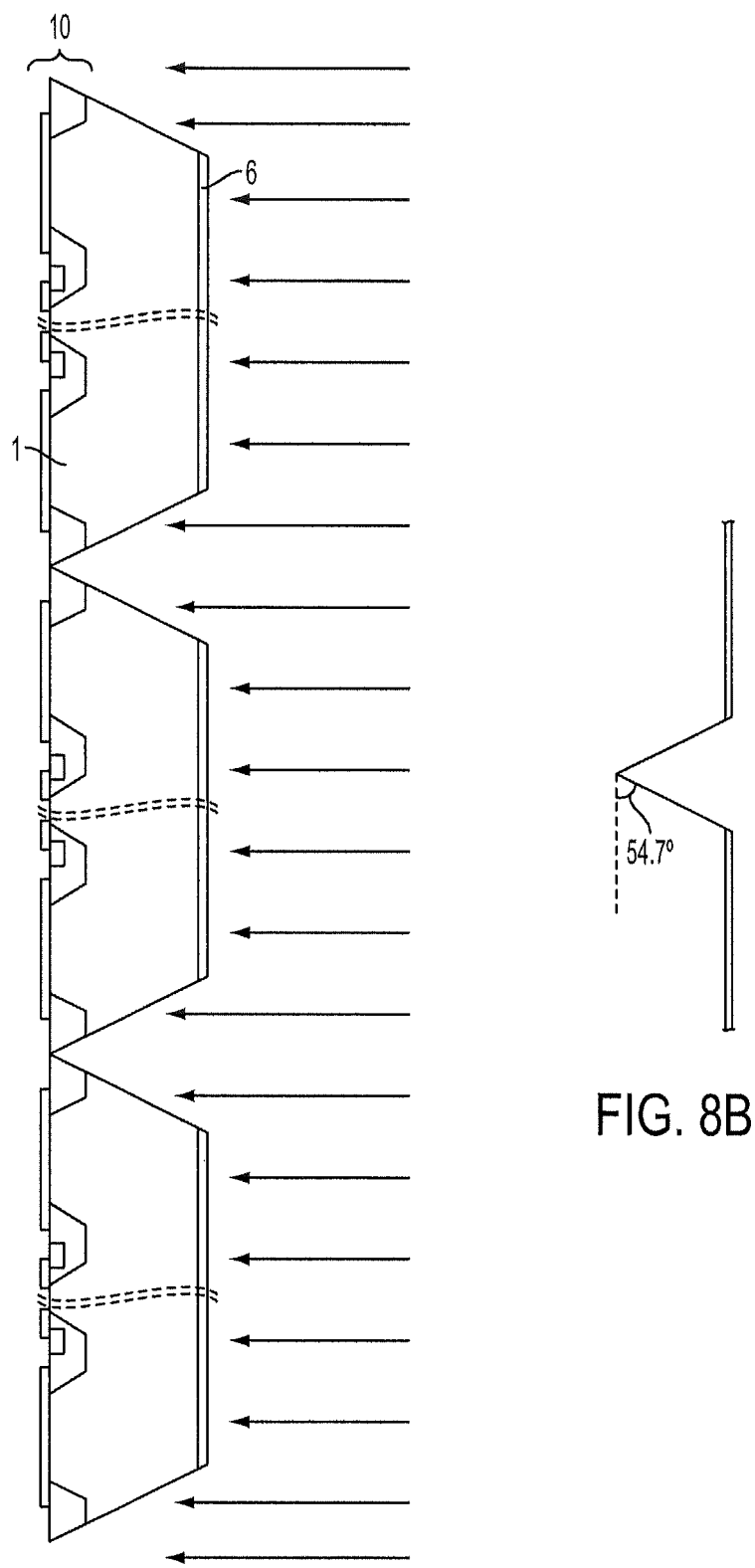
FIGS. 8A and 8B are semiconductor sectional views showing a direction in which ions are implanted to form a separation layer on tapered surfaces.

Boron ions are implanted into the wafer 1 in which the collector side aperture taper is formed as previously described in order to form the p-type collector layer 6 and a p-type separation layer 4b. The boron ion implantation is carried out in the necessary pattern separately from a side edge surface or the aperture portion of the oxide mask formed on the rear surface. Although the implantation of boron ions into each of the four side edge surfaces and the rear surface in the wafer 1 can also be carried out at one time in a vertical direction from the main surface (the rear surface side) of the wafer 1, it is preferable, from the point of view of ion implantation efficiency, that the rear surface (collector surface) is covered with an oxide mask 2, and that the ions are selectively implanted in the direction shown by the arrows into only one direction of side edge surface, as shown in FIG. 1. The side edge surface of the wafer into which the ions are implanted is changed, and the ions are implanted in the same way. The implantation of ions into the four side edge surfaces is finished by carrying out the ion implantation in the same way four times, once for each side edge surface, the collector surface oxide mask is removed, and ions are implanted in a vertical direction into the collector surface. In an activation step using a flash lamp annealing too, selectively carrying out the activation separately for the collector layer and side edge surface separation layer is preferable in that it is possible to set flash lamp radiation energy at a maximum optimal value in each case, and it is possible to activate efficiently. In a manufacturing method having a step of forming only the p-type separation layer 4b along the side edge surfaces by ion implantation separate from that for the collector layer, and an activation step, in this way, there is an advantage in that it can also be applied to a reverse block-type IGBT with the sectional shape shown in FIG. 7A having a reversely oriented emitter side aperture taper wherein the n-type emitter region 15 side front surface is narrower. Also, with the kind of reverse block-type IGBT shown in FIG. 7B or FIG. 1 having a collector side aperture taper oriented in such a way that the p-type collector layer 6 side is narrower, the ion implantation into or flash lamp annealing of the p-type collector layer 6 and p-type separation layer 4b may be carried out simultaneously, as shown in FIGS. 8A and 8B, rather than the p-type collector layer 6 and p-type separation layer 4b being formed separately by the ion implantation and flash lamp annealing. In this case, as the radiation energy density is limited, the activation efficiency may deteriorate a little, but it is possible to eliminate the mask formation step necessary when forming the p-type collector layer 6 and p-type separation layer 4b separately, and it is possible to suppress the process cost.

With the ion implantation, when introducing boron at a tilt angle of 0° from the p-type collector layer 6 side on the rear surface side, which has become narrower due to the formation of the collector side aperture taper, as shown in FIGS. 8A and B, the effective dose and implantation range with respect to the side edge surfaces, compared with the dose and implantation range for a flat collector surface, are the angle of the tapered surface determined in the plane direction by the anisotropic etching multiplied by its cosine, that is, cos 54.7°=0.58 times (for the Si 111 surface). Also, for the Si 211 surface, the effective dose and implantation range are cos 65.9°=0.408 times. In the same way, as the radiation energy density for the flash lamp annealing when forming the p-type separation layer 4b is also 0.58 times the radiation energy density for the flash lamp annealing of the p-type collector layer 6 surface, it is necessary to consider this point when determining the radiation energy when implanting or irradiating with the ion implantation shown by the arrows at a tilt angle of 0°, that is, perpendicular to the main surface. This is because, when the radiation energy density is too high, there is a danger of the crystal melting, and of the semiconductor properties being lost.

In the first embodiment, a flash lamp annealing using xenon is used in the activation of ion implantation layers for the formation of the p-type collector layer on the rear surface of the reverse block-type IGBT and for the formation of the p-type separation layer on the side edge surfaces. With this flash lamp annealing, when carrying out the annealing of the rear surface p-type collector layer and p-type separation layer separately, it is possible to focus the strongest portion (the central portion of heating) of the optimal radiation energy density of a separate xenon lamp on each layer, but in actual practice, the strongest portion of the radiation energy is focused on a depth position ranging from the upper portion to the central portion of the separation layer for both the rear surface p-type collector layer and p-type separation layer. When the annealing of the rear surface collector layer and separation layer is carried out at one time, the width (extent or depth) of the central portion of heating of the xenon lamp is in the region of ±100 μm, meaning that it is better that the strongest portion (the central portion of heating) of the radiation energy of the xenon lamp is focused on a region ranging from the upper portion to the central portion of the separation layer.

Figure 12:
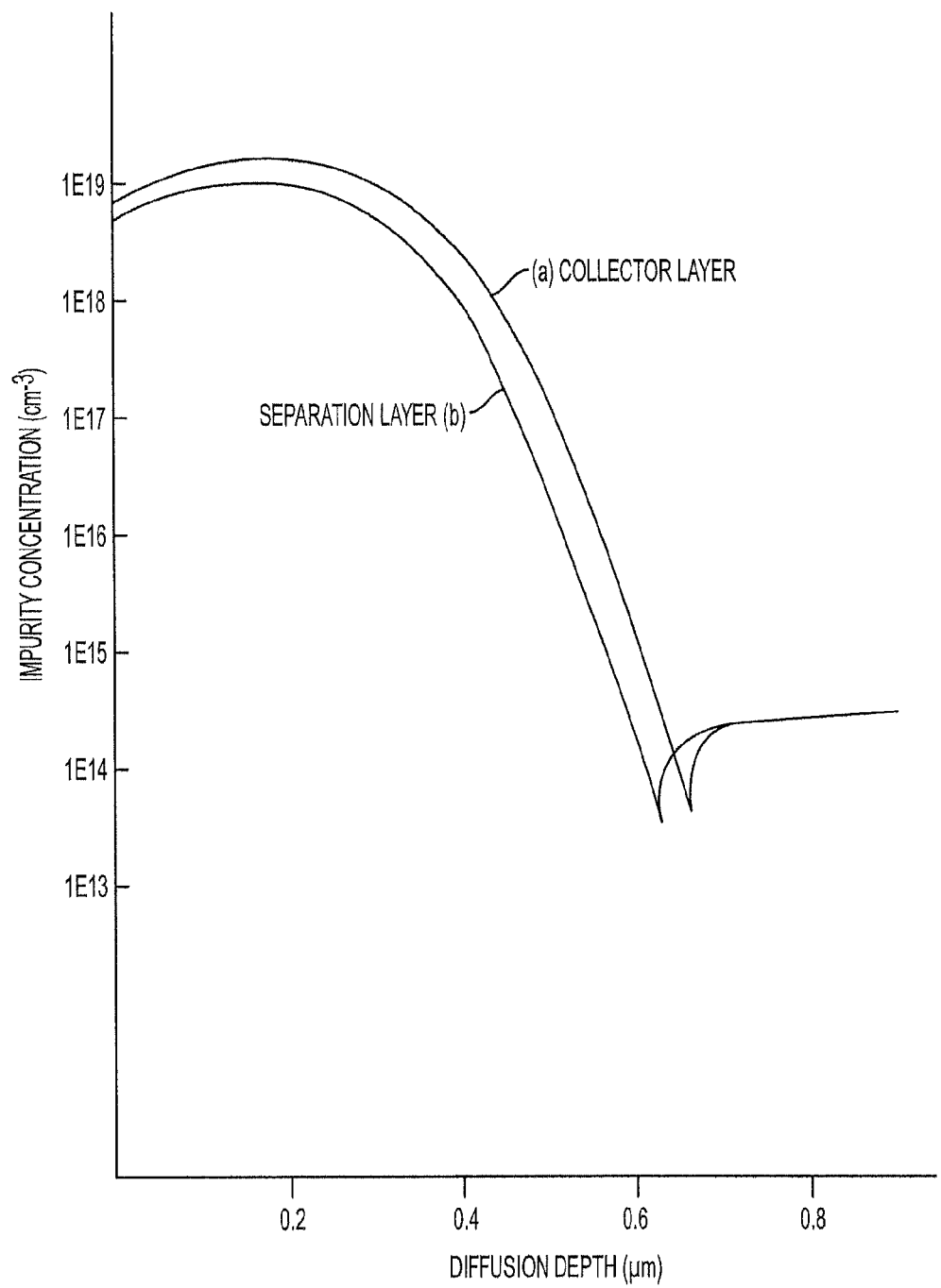
FIG. 12 is an impurity concentration profile diagram of a separation layer formed by activating the region in which ions are implanted into the tapered surfaces using a flash lamp annealing, according to a first embodiment of the invention.

After an ion implantation with a boron dose of $1 \times 10^{15}$ cm$^{-2}$ and accelerated energy of 150 keV, an activation is carried out using flash lamp annealing (pulse width 1 msec). As shown in FIG. 12, an impurity concentration profile diagram of a rear surface p-type collector layer a and a side edge surface p-type separation layer b when activating with a radiation energy density of 30 J/cm$^2$ is obtained by measuring the spreading resistance (SR). The vertical axis of FIG. 12 shows the impurity concentration (cm$^{-3}$), and the horizontal axis a diffusion depth (μm). The value 1E13, or the like, of the impurity concentration on the vertical axis is an abbreviation representing the number $1 \times 10^{13}$, wherein the number 13 to the right of E (an abbreviation of exponential) represents the exponent (index) of 10. The meaning of this abbreviation is common to all the impurity concentration profile diagrams described hereafter. In FIG. 12, a indicating the rear surface p-type collector layer, and b indicating the p-type separation layer, are profiles of the impurity concentration measured at the surface of each. According to FIG. 12, the peak impurity concentration exceeds $1 \times 10^{19}$ cm$^{-3}$ in both the rear surface collector layer and the side edge surface separation layer, indicating that they are sufficiently activated. Although the peak impurity concentration is of the same level as the peak impurity concentration in the case of the laser annealing of the comparison example (previously known example) shown in FIG. 9, to be described hereafter, it can be seen that the diffusion depth on the horizontal axis, particularly for the tapered surface of the separation layer of b, is slightly larger than in the case of the laser annealing of the comparison example (FIG. 9), because a thermal diffusion effect due to the flash lamp annealing of the first embodiment (FIG. 12) can be expected.

Figure 11:
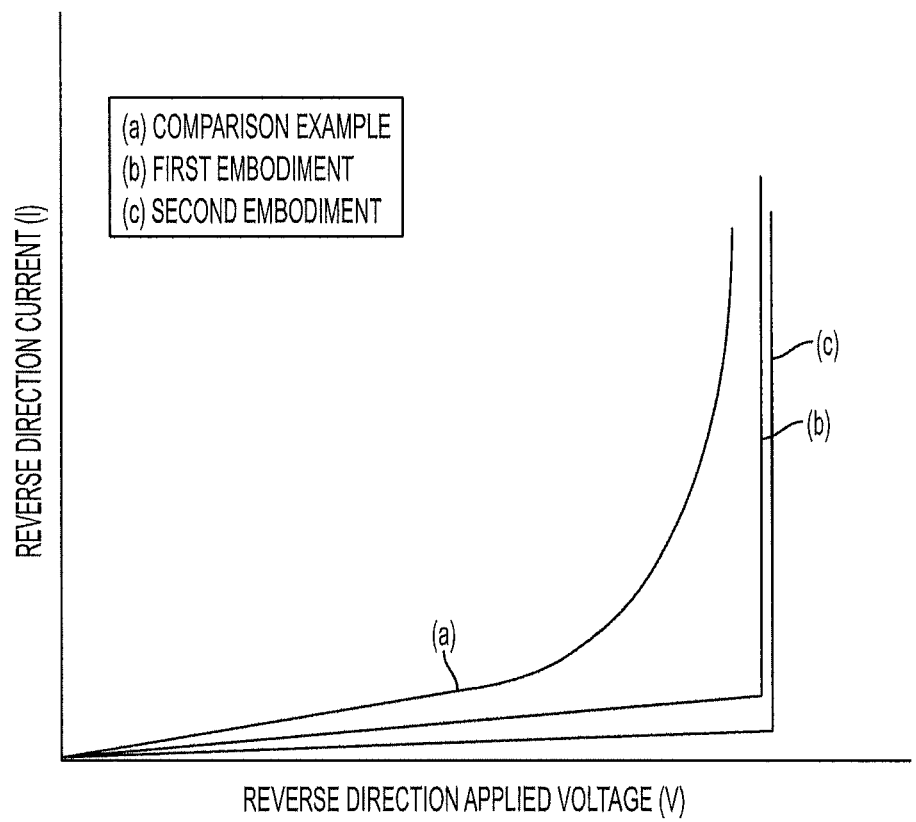
FIG. 11 is a reverse direction current-voltage waveform diagram of embodiments of the invention and a previously known reverse block-type IGBT (a comparison example)

Also, when monitoring crystal defects 20 (point defects) in a cross-section of the p-type collector layer and side edge surface p-type separation layer, no crystal defect (point defect) exists in either the rear surface collector layer or side edge surface separation layer. In FIG. 11, reverse direction current-voltage waveforms a, b, and c are shown in the order of the comparison example (to be described hereafter), the first embodiment, and a second embodiment (to be described hereafter). As shown in FIG. 11, it can be seen that the reverse direction current (reverse leakage current) (b in FIG. 11) of the reverse block-type IGBT fabricated according to the first embodiment is smaller than that of the comparison example of laser annealing of a in FIG. 11. This means that, as the crystal defects 20 (point defects) accompanying the implantation of ions into the side edge surface separation layer are sufficiently restored and eliminated by the flash lamp annealing, the leakage current when reverse biasing has become smaller. That is, it indicates that using the flash lamp annealing is effective.

Also, the annealing using a xenon flash lamp has a feature wherein it is possible to heat only a region at a depth of approximately 1 μm from the wafer surface, for a short time of only a few milliseconds, to 1,000° C. or more, which is the dopant activation temperature at a time of an ion implantation. To date, flash lamp annealing has been used in the activation of an extension (diffusion region) portion of an integrated circuit in which miniaturization is extremely advanced, such as an ultra-shallow junction. This method has an advantage in that it is possible to reduce power consumption too, to one-third or less, due to the fact that a raising and lowering of temperature is possible in an even shorter time than with a heating annealing using a normal diffusion furnace, or a rapid thermal annealing (RTA) method that rapidly heats a sample using a lamp heating with an infrared lamp, a halogen lamp, or the like. As it is preferable in order to use the method for an ultra-shallow junction necessary in an integrated circuit (IC), or the like, that no thermal diffusion occurs in the ion implantation layer, it has been employed with attention focused particularly on the short time temperature rise.

As opposed to this, with the reverse block-type IGBT according to embodiments of the invention, there is an aspect wherein it is acceptable that thermal diffusion occurs in the rear surface collector layer and side edge surface separation layer, and more than this, it is preferable that there is spreading due to thermal diffusion in a diffusion layer. Consequently, in accordance with the embodiments of the invention, the method is employed with attention focused on its superior ion implantation layer activation capability, and on its high capability for causing crystal defects to recover, superior to that of the previously known laser annealing, rather than on the short time temperature rise.

As previously described, according to the flash lamp annealing, it is possible to realize the activation of the side edge surface p-type separation layer and rear surface side p-type collector layer in a short time (a few milliseconds). Also, whereas the laser annealing has a laser irradiation time of 10 ns to 1 μs, the irradiation time with the flash lamp annealing (of a few milliseconds) is longer. Therefore, the time given over to the activation is also longer, which has the effect of making it possible to increase the spread in the diffusion layer. Also, it is thought that longer irradiation time is useful in the restoration of defects in the ion implantation layer.

Second Embodiment

A description will be given of a second embodiment relating to the manufacturing method of the reverse block-type IGBT. In the second embodiment, in the same way as in the first embodiment, flash lamp annealing using xenon is used in the activation of boron ion implantation layers formed on the rear surface collector surface and side edge surfaces of the reverse block-type IGBT, rather than the previously known laser annealing. A point differing from the first embodiment is that, in the second embodiment, the wafer substrate temperature is raised to and held at a high temperature equal to or lower than the melting temperature of a front surface side metal electrode (for example, approximately 500° C. when the front surface side metal electrode is a metal film having Al as a main element) before carrying out an irradiation with the flash lamp, and the flash lamp annealing is carried out in this condition.

Figure 13:
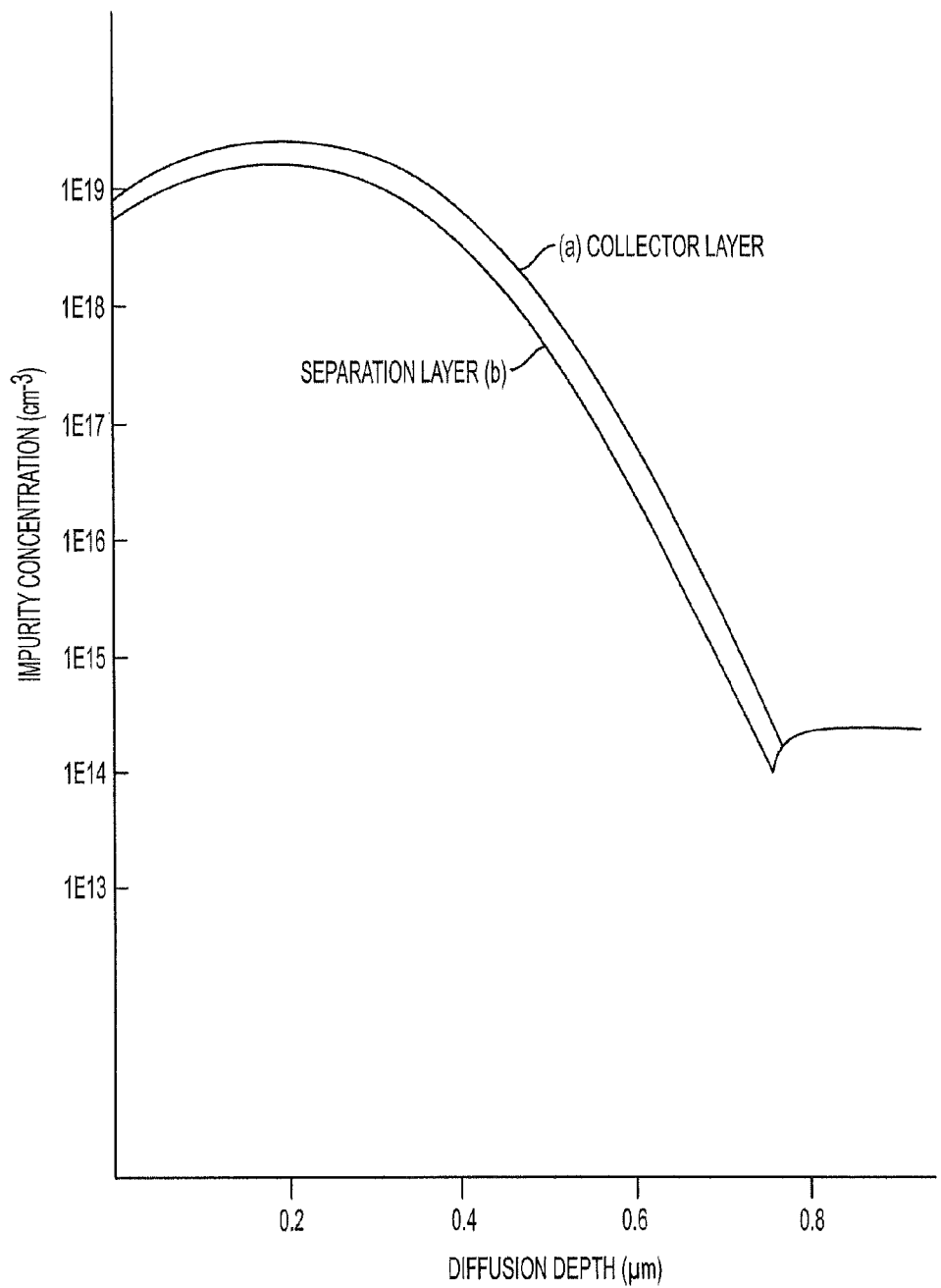
FIG. 13 is an impurity concentration profile diagram of a separation layer formed by activating the region in which ions are implanted into the tapered surfaces using a semiconductor substrate heating and the flash lamp annealing, according to a second embodiment of the invention.

After an ion implantation with a boron dose of $1\times10^{15}$ cm$^{-2}$ and accelerated energy of 150 keV, the wafer substrate temperature is held at 450° C. (constant) before carrying out irradiation with the flash lamp in order to activate. Subsequently, using flash lamp annealing (pulse width 1 msec), activation is carried out with a radiation energy density of 30 J/cm$^2$, and an impurity concentration profile of the rear surface p-type collector layer and the side edge surface p-type separation layer is obtained from an SR measurement, as shown in FIG. 13. As the substrate holding temperature when annealing must be a temperature such that the Al electrode already formed on the front surface side does not melt, it is necessary to keep it at 500° C. or lower. According to the impurity concentration profile shown in FIG. 13, the peak impurity concentration exceeds $1\times10^{19}$ cm$^{-3}$ in both the rear surface p-type collector layer and the side edge surface p-type separation layer, indicating that they are sufficiently activated. Although the peak impurity concentration value is of the same level as the peak impurity concentration of the previously known comparison example laser annealing (FIG. 9), it is shown that, as the thermal diffusion effect of the impurities is greater than in the case of the previously known laser annealing (FIG. 9), and greater than in the first embodiment (FIG. 12), the diffusion depth is larger.

Also, although crystal defects (point defects) in a cross-section of the rear surface p-type collector layer and side edge surface p-type separation layer are monitored, no crystal defect (point defect) exists in either the rear surface p-type collector layer or side edge surface p-type separation layer. Because of this, it can be understood why the reverse direction current (reverse leakage current) of the second embodiment is even smaller than in the comparison example laser annealing of the comparison example shown in a of FIG. 11, and of the first embodiment (b of FIG. 11), as shown in the reverse direction current-voltage waveform c of FIG. 11. Furthermore, as the crystal defects 20 (point defects) accompanying the implantation of ions into the side edge surface separation layer are sufficiently restored, and further still, there also being a diffusion effect due to heating by the substrate temperature, the separation layer is deeper than in the case of the first embodiment, it is indicated that the leakage current when reverse biasing becomes smaller. Because of this, it is understood that not only the use of the flash lamp annealing but also the effect of the wafer heating is effective. Herein, although a description has been given of an n-type reverse block-type IGBT wherein boron ions are caused to diffuse in the p-type separation layer, it is also possible to use aluminum as p-type impurity ions. Also, by using phosphorus ions for an n-type separation layer dopant in a p-type reverse block-type IGBT wherein the conductivity type is the reverse, it is possible to fabricate a device in the same way.

Also, in accordance with embodiments of the invention, a flash lamp annealing using a xenon lamp is preferable, but as there is no problem with using lamp annealing using an infrared lamp or halogen lamp, provided that a flash lamp radiation energy density with a pulse width of a few milliseconds and the high energy density necessary for activation can be obtained, this is included in the flash lamp annealing of embodiments of the invention. 20 J/cm$^2$ to 40 J/cm$^2$ is preferable as the flash lamp radiation energy density.

When using the previously known normal flash lamp annealing in an integrated circuit (IC) or the like, it is used as far as possible so as not to cause thermal diffusion of the implanted ions, as previously described, but when applied to the rear surface or side edge surfaces of an element, as in embodiments of the invention, it is instead preferable that diffusion occurs. Therefore, when carrying out the flash lamp annealing, keeping the wafer temperature at a high temperature equal to or lower than the melting temperature of the front surface side Al electrode and carrying out the flash lamp annealing have the effect of further activating (increasing the concentration and increasing the diffusion depth) the side edge surfaces of the separation layer and the rear surface side diffusion layer. Because of these effects, a separation layer with no crystal defect is formed, and it is then possible to suppress the leakage current when reverse biasing.

Comparison Example

Hereafter, a description will be given for a comparison example (hereinafter "previously known example") wherein activation using the previously known laser annealing is carried out after an implantation of boron ions into the rear surface and tapered side edge surfaces of a wafer. Also, the known laser annealing is taken to be a case wherein the ion implantation and annealing for the p-type collector layer and p-type separation layer are carried out separately. Furthermore, the description will be given centered on a reverse block-type IGBT having a collector side aperture taper formed oriented such that the emitter side front surface is wide and the collector side rear surface is narrow. The manufacturing process as far as forming this kind of taper is the same as that described in the first and second embodiments.

The ion implantation for forming the p-type collector layer and p-type separation layer is carried out in the necessary pattern from a side edge surface or the aperture portion of an oxide mask formed on the rear surface. Although the implantation of ions into each of the four side edge surfaces in the wafer can be carried out at one time, it is also possible to carry out doping from an inclination different from the angle of the tapered surface by changing the inclination of the wafer and carrying out an implantation for each edge for a total of four implantations, as in FIG. 1, so that the ion implantation efficiency improves. With the previously known laser annealing, only a place desired to be irradiated is scanned and irradiated by controlling and the like using a mask or shutter of stainless steel (SUS), or the like. Provided that a manufacturing method has a step of forming only the separation layer along the side edge surfaces in this way, it can also be applied to a reverse block-type IGBT having a reversely oriented emitter side aperture taper wherein the emitter side is narrower. Also, with a reverse block-type IGBT having a collector side aperture taper oriented such that the collector side is narrower, the ion implantation into and previously known laser annealing of the collector layer and separation layer may be carried out simultaneously, rather than separately carrying out ion implantation into and laser annealing of the p-type collector layer and p-type separation layer.

With the ion implantation, in the same way as previously described, when implanting boron ions at a tilt angle of 0° from the collector surface side on the rear surface side, which has become narrower due to the formation of the collector side aperture taper, as shown in FIGS. 8A and B, the effective dose and implantation range with respect to the side edge surfaces are 0.58 times that in the case of a perpendicular implantation. The energy density for the laser annealing when forming the separation layer is also 0.58 times the energy density radiated for the annealing of the collector surface.

Figure 9:
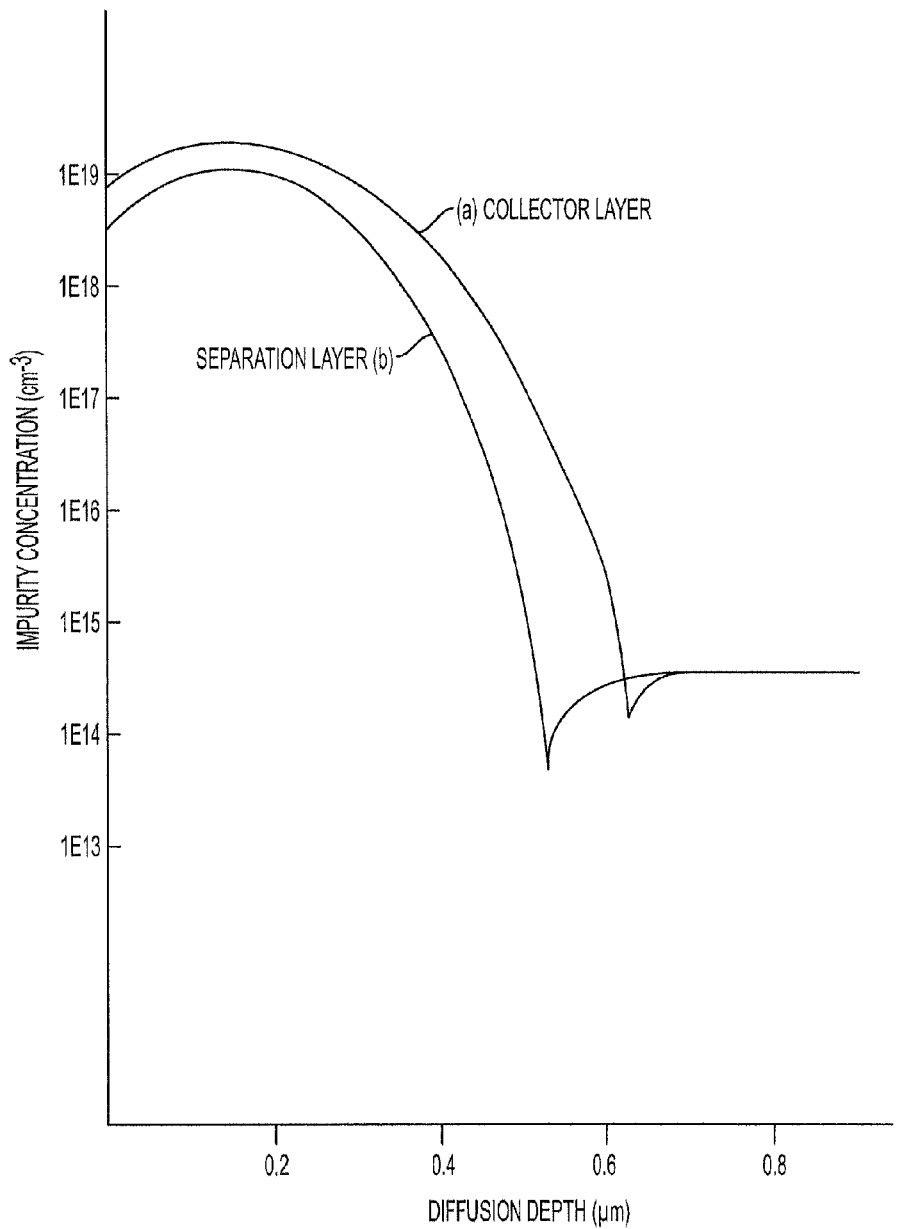
FIG. 9 is an impurity concentration profile diagram (a comparison example) of a separation layer formed by activating a region in which ions are implanted into the tapered surfaces using a previously known laser annealing.
Figures 10A, 10B:
FIGS. 10A and 10B are sectional views (a comparison example) of a separation layer portion showing a residual condition of crystal defects when activating the region in which ions are implanted into the tapered surfaces using the previously known laser annealing.

FIG. 9 is an impurity concentration profile diagram of a rear surface p-type collector layer a and a side edge surface separation layer b obtained from an SR measurement when implanting ions with a boron dose of $1\times10^{15}$ cm$^{-2}$ and accelerated energy of 150 keV, and activating with the radiation energy density of the previously known laser annealing at 3.0 J/cm$^2$ using a YAG2ω laser (wavelength 532 nm, pulse width 100 ns). FIGS. 10A and 10B are sectional views showing a result of monitoring the crystal defects 20 (point defects) in cross-sections of the rear surface collector layer a and side edge surface separation layer b when irradiated under the conditions of the previously described ion implantation and previously known laser annealing. The point defects 20 are shown as black points.

In FIGS. 10A and 10B, it can be seen that no crystal defect 20 (point defect) exists in the rear surface collector layer (FIG. 10A), but that a large number of crystal defects 20 (point defects) exist in the side edge surface (FIG. 10B).

Also, FIG. 11A is a reverse direction current-voltage waveform diagram showing a leakage current (hereafter, a reverse leakage current) when reverse biasing each reverse block-type IGBT. It can be seen from FIG. 9 that the peak concentration exceeds $1\times10^{19}$ cm$^{-3}$ in both the rear surface collector layer and the side edge surface separation layer, and that they are activated. However, it is shown that the diffusion depth is small in comparison with FIGS. 12 and 13 relating to the first and second embodiments. As a result, in the comparison example of FIG. 11A, the reverse direction current is larger than with the flash lamp annealing of FIGS. 11B and 11C relating to the first and second embodiments. This indicates that as a large number of the crystal defects 20 (point defects) accompanying the implantation of ions into the side edge surface separation layer remain near the p-n junction without being sufficiently restored by the previously known laser annealing, unlike in the rear surface side collector layer, the leakage current when reverse biasing has increased.

As described, according to the first and second embodiments, with a manufacturing method of a reverse block-type IGBT having a separation layer formed by forming a V-shaped groove using an anisotropic etching and carrying out ion implantation and flash lamp annealing on the tapered surfaces thereof, a rear surface collector layer and separation layer are formed wherein crystal defects caused by the ion implantation are sufficiently restored, it is possible to suppress the leakage current when reverse biasing, and it is possible to provide a reverse block-type IGBT exhibiting a stable pressure resistance yield rate.

Third Embodiment

A third embodiment of the manufacturing method of the reverse block-type IGBT uses a laser annealing according to embodiments of the invention, which is an improvement of the previously known laser annealing, in the activation of the ion implantation layer for forming the collector layer and side edge surface separation layer, and in particular, in the activation of the ion implantation layer for the separation layer, in which crystal defects are liable to remain.

Figure 14:
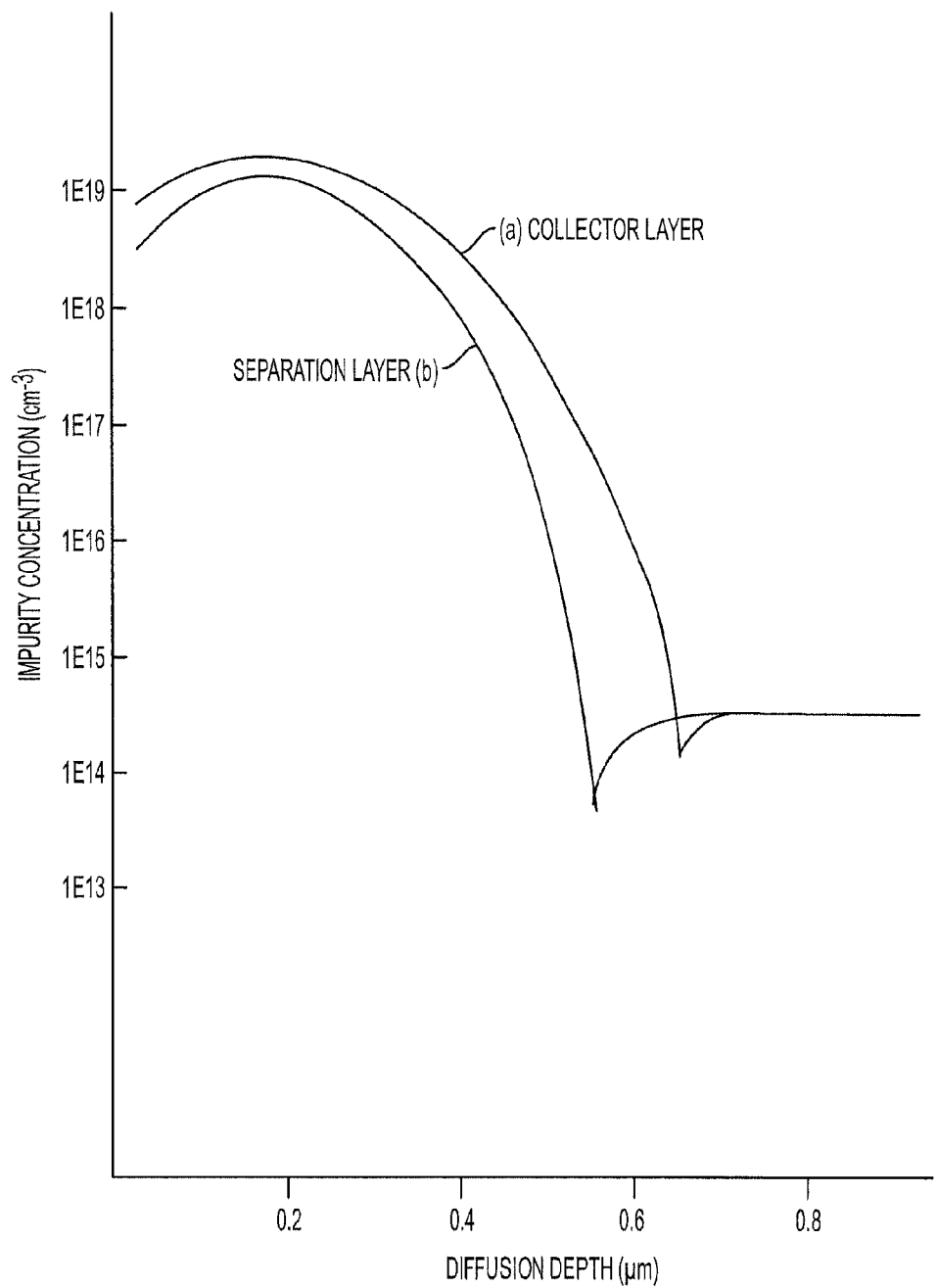
FIG. 14 is an impurity concentration profile diagram of a separation layer formed by activating the region in which ions are implanted into the tapered surfaces using a laser annealing, according to a third embodiment of the invention.

In the third embodiment, after an implantation of ions with a boron dose of $1\times10^{15}$ cm$^{-2}$ and accelerated energy of 150 keV into the collector side aperture taper formed in the wafer, an activation is carried out using the YAG2ω laser (wavelength 532 nm, pulse width 100 ns) with the radiation energy density of the laser annealing according to embodiments of the invention at an energy density of 3.6 J/cm$^2$, higher than the 3.0 J/cm$^2$ of the comparison example. Moreover, it is a method whereby the radiation energy density, which is more likely to decrease in a tapered surface than in a perpendicular surface, is compensated utilizing the reflected light of the laser irradiation, and activation is carried out effectively. FIG. 14 is an impurity concentration profile diagram of a rear surface p-type collector layer a and a side edge surface p-type separation layer b obtained from an SR measurement in the case of the third embodiment. It can be seen from the impurity concentration profile diagram shown in FIG. 14 that, as the peak concentration exceeds $1\times10^{19}$(cm$^{-3}$) in both the collector layer and the side edge surface separation layer, they are sufficiently activated. Also, FIG. 14 shows that the peak concentration is slightly higher, by the amount by which the radiation energy density is higher than the condition for the laser annealing of the comparison example (previously known example) of FIG. 9, and the diffusion depth is also slightly larger because the diffusion effect due to heat is large compared with the case of the laser annealing of the comparison example (FIG. 9).

Figures 15A, 15B:
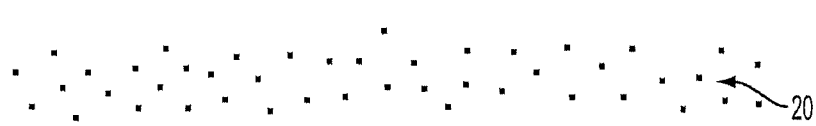
FIGS. 15A and 15B are sectional views of a separation layer portion showing a residual condition of crystal defects when activating the region in which ions are implanted into the tapered surfaces using the laser annealing, according to the third embodiment of the invention.
Figure 28:
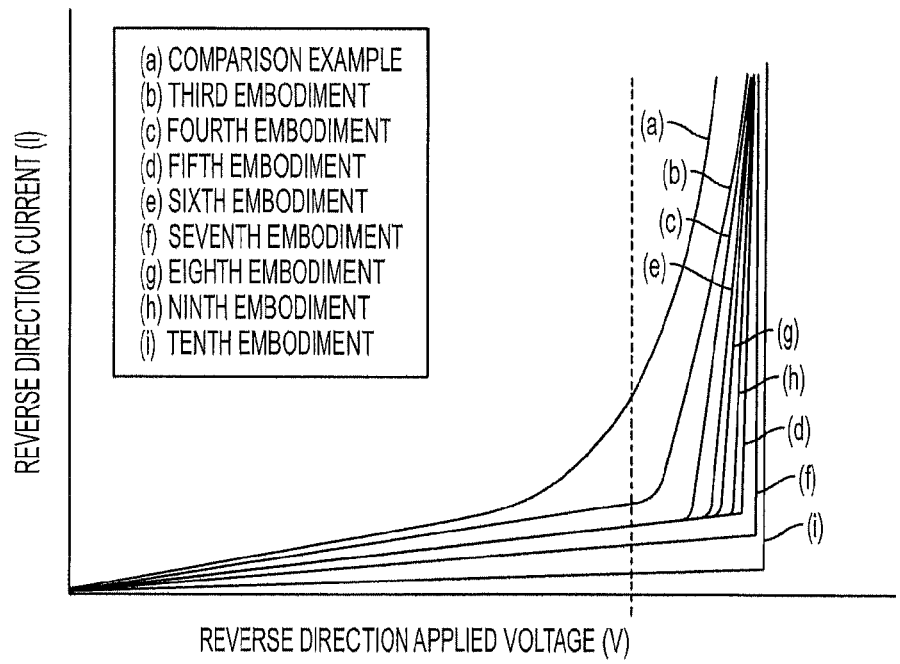
FIG. 28 is a reverse direction current-voltage waveform diagram of the invention and the previously known reverse block-type IGBT.

FIGS. 15A and 15B are sectional views showing the condition of crystal defects remaining in the lower layer of the collector surface a and the inner side of the side edge surface separation layer b after the laser annealing according to embodiments of the invention. In FIG. 15B, the point defects 20 are shown as black points. A larger number of black points indicates a relatively higher point defect density. FIG. 15A shows that no crystal defect exists in the lower layer of the collector surface. Also, particularly, FIG. 15B shows that the crystal defect density of the side edge surface separation layer inner side portion is low in comparison with the comparison example (FIG. 10B), and that the defects have been slightly restored. As a result of this, the reverse direction current (reverse leakage current) in the case of the third embodiment (FIG. 28B) is smaller than in the laser annealing comparison example shown in FIG. 28A. This indicates that the crystal defects occurring with the implantation of ions into the inner side of the side edge surface separation layer have been slightly restored by the laser annealing according to embodiments of the invention. As a result, it is thought that the leakage current when reverse biasing is smaller than in the comparison example (FIG. 28A). FIG. 28A is the same as FIG. 11A.

With a silicon semiconductor, in the case of laser irradiation, there is a danger that crystal melting will occur with a radiation energy density of 5 J/cm$^2$ or more, and that the semiconductor characteristics will be destroyed. Consequently, a radiation energy density of 5 J/cm$^2$ is the upper limit for laser irradiation. Also, the lower limit of the energy density of a laser irradiation for making an activation effective after an ion implantation is approximately 1.2 J/cm$^2$. Because of this, when carrying out laser irradiation with the focal point adjusted on a flat surface, the tapered surface energy density of the reverse block-type IGBT of embodiments of the invention is cos 65.9°=0.408 times at the Si 211 surface. Consequently, in order to make the laser radiation energy density at the 211 surface 1.2 J/cm$^2$ or more, 1.2/0.408=2.94 J/cm$^2$ is the lower limit at the 211 surface. When carrying out a laser irradiation of the p-type collector layer 6 and p-type separation layer 4b at a tilt angle of 0°, it is necessary to determine the maximum radiation energy density with the laser irradiation of the p-type collector layer 6 as a reference. As a result of this, the activation of the p-type separation layer 4b is likely to be insufficient.

Figure 16:
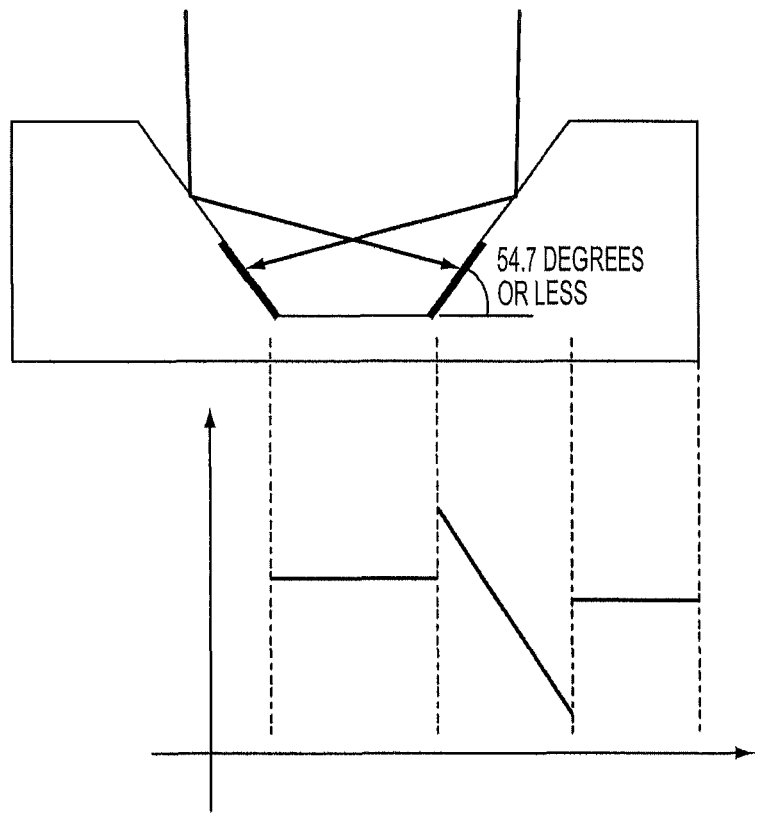
FIG. 16 is a semiconductor substrate sectional view showing reflected laser light at a time of a tapered surface laser irradiation, according to the third embodiment of the invention.
Figure 17:
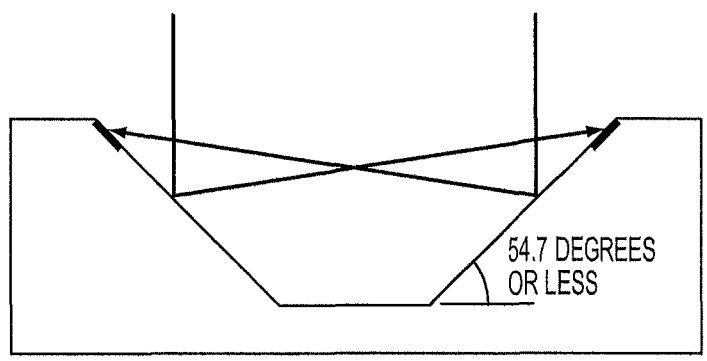
FIG. 17 is a semiconductor substrate sectional view showing laser light reflected by a V-shaped groove taper angle adjustment, according to the third embodiment of the invention.

FIG. 16 is a diagram illustrating the reason that the crystal defects are restored and reduced by the laser annealing according to embodiments of the invention more than in the comparison example. The laser irradiation light (arrows) hitting the side edge surface inclinations (tapered surfaces) is reflected below the side edge surfaces by a single reflection. Because of this, with a laser radiation energy density at 3.6 J/cm$^2$, larger than the 3.0 J/cm$^2$ of the previously known example, a radiation energy density of 3.1 J/cm² is applied below the side edge surfaces. This radiation energy density of 3.1 J/cm is calculated, roughly, based on the combination of the effective radiation energy density for the tapered surfaces of 2.1 J/cm² and the energy density of the reflected light of 1.05 J/cm² (i.e., 2.1 J/cm² (≅3.6 J/cm²×0.58 times)+1.05 J/cm² (50% of ≅2.1 J/cm²)≅3.1 J/cm²). Because of this, a radiation energy density equivalent to or larger than the radiation energy density (3.0 J/cm²) of the laser irradiated surface (collector surface) of the previously known example is applied to the side edge surfaces too, and it is possible to further restore the crystal defects of the inner side of the side edge surface separation layer. Also, in the third embodiment, a case is shown of a tapered surface inclination angle 54.7° (FIG. 16) determined by the crystal orientation of side edge surfaces formed by a silicon wet etching for forming a V-shaped groove. However, furthermore, when forming the V-shaped groove with a gentle inclination angle (less than 54.7°), as shown in FIG. 17, the reflection destination of the laser irradiation is above the previously described side edge surface bottom portion and, as it is possible to cause light to be reflected onto the central portion or upper portion of the side edge surfaces, it is possible to further restore the crystal defects in the regions hit by the reflected light. By adjusting the radiation energy density by adjusting the inclination angle of the side edge surfaces, thus adjusting the position irradiated by the reflected light of the laser, in this way too, it is possible to adjust the activation and crystal defect restoration of a device having V-shaped groove side edge surfaces.

Fourth Embodiment

A fourth embodiment of the manufacturing method of the reverse block-type IGBT uses a laser annealing according to embodiments of the invention, different from that of the third embodiment, in the activation of the ion implantation layer of the collector layer and side edge surface separation layer.

In order to carry out an activation using the YAG2ω laser (wavelength 532 nm, pulse width 100 ns) after an implantation of ions with a boron dose of 1×10¹⁵ cm⁻² and accelerated energy of 150 keV into the collector side aperture taper formed in the wafer, the focal position of the laser irradiation light is adjusted to a position from the upper portion to the central portion of the side edge surfaces, with the radiation energy density of the laser annealing at 3.6 J/cm². An impurity concentration profile diagram of a collector layer a and a side edge surface separation layer b obtained from an SR measurement in the case in which the focal position is adjusted to a position from the upper portion to the central portion of the side edge surfaces is approximately the same as in FIG. 14. Thus, it is possible to achieve sufficient activation.

It is possible to further restore the crystal defects in the lower portion of the side edge surfaces using the method utilizing the reflected light of a laser irradiation described in the third embodiment. However, if the side edge surfaces are long, it is difficult to restore the crystal defects in the side edge surface upper portion, which is not easily affected by the reflected light. Consequently, even when carrying out the laser irradiation using the reflected light shown in the third embodiment in a position from the upper portion to the central portion of the side edge surfaces, it is difficult for the radiation energy density to rise, and there is a tendency for crystal defects to likely remain. Therefore, in the fourth embodiment, unlike in the third embodiment, a method is employed whereby the center of the focal point at a time of a laser irradiation is brought to a position from the upper portion to the central portion of the side end portion, as with the flash lamp annealing of the first embodiment, although this also depends on the focal point depth of the laser (the focal point depth of the laser in the fourth embodiment is 100 µm). According to the laser annealing of the fourth embodiment, it is possible to effectively restore the crystal defects in a position from the upper portion to the central portion. Furthermore, it is also possible to carry out the laser annealing for forming the collector layer and that for the side edge surface separation layer separately.

Figures 18A, 18B:
FIGS. 18A and 18B are semiconductor substrate sectional views showing a condition of crystal defects when adjusting a laser irradiation focal point to a position from the upper portion to the central portion of the tapered surfaces, according to a fourth embodiment of the invention.

FIGS. 18A and 18B show the condition of crystal defects in the collector surface and in a position from the upper portion to the central portion of a side edge surface. It can be seen that no crystal defect exists in the lower layer of the collector surface, and also, there are less crystal defects in the position from the upper portion to the central portion of the side edge surface than in the comparison examples (FIG. 10B and FIG. 15B of the third embodiment), as shown in FIG. 18B, and that the defects have been restored. It is indicated that the reverse direction current (reverse leakage current) of the fourth embodiment (FIG. 28C) is smaller than in the laser annealing comparison example of FIG. 28A. This indicates that the laser annealing of the fourth embodiment is effective in restoring the crystal defects accompanying the implantation of ions into the side edge surface separation layer, as a result of which, it is thought that the leakage current when reverse biasing is smaller.

Fifth Embodiment

In a fifth embodiment relating to the invention, a flash lamp annealing is used in the activation of the ion implantation layers of the collector layer and side edge surface separation layer. At a time of flash lamp annealing, the flash lamp annealing is carried out after adjusting the focal point in such a way that the focal position comes between the upper portion and the central portion of the side edge surface separation layer.

Figure 19:
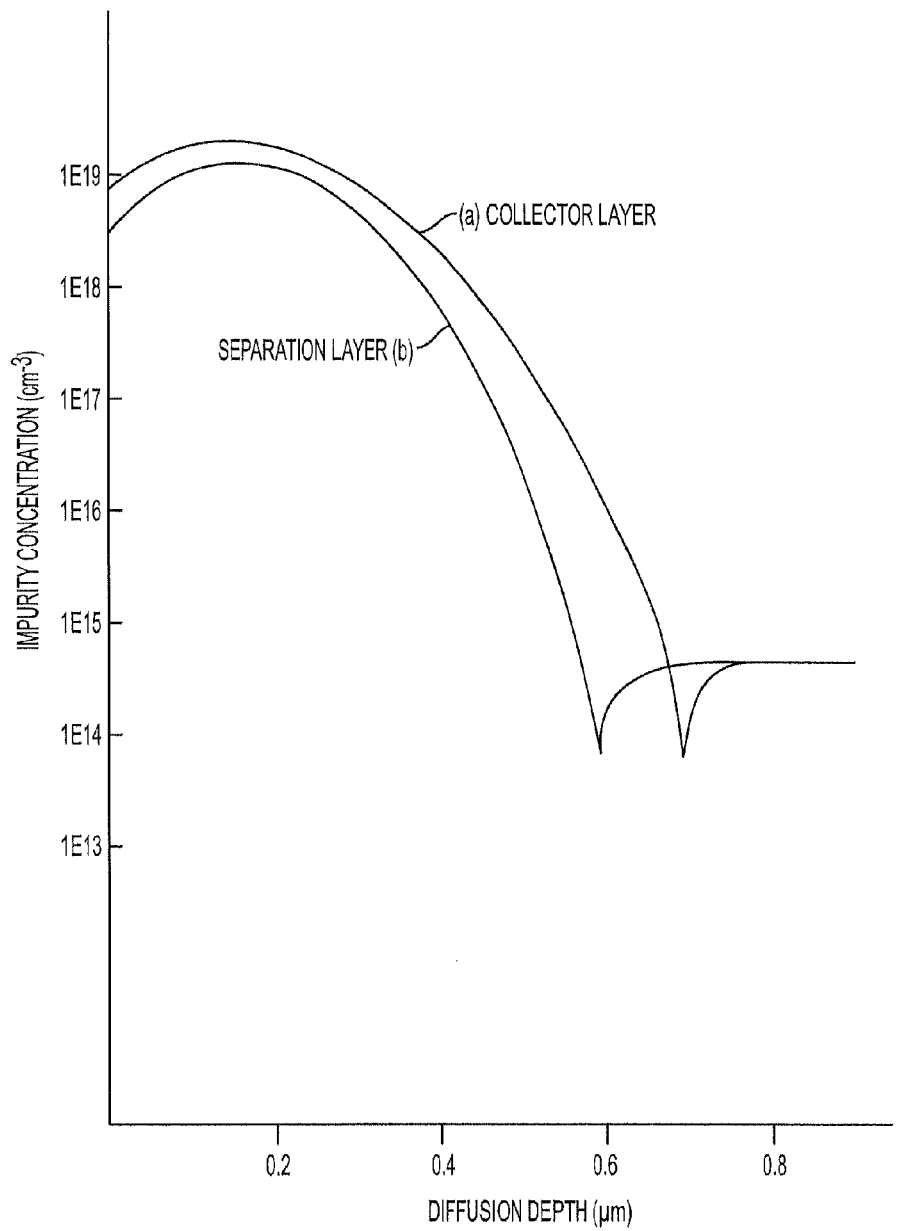
FIG. 19 is an impurity concentration profile diagram when adjusting a flash lamp focal point to a position from the upper portion to the central portion of the tapered surfaces, according to a fifth embodiment of the invention.

FIG. 19 is an impurity concentration profile diagram of a rear surface p-type collector layer a and a side edge surface separation layer b obtained from an SR measurement when activating using a flash lamp annealing (pulse width 1 msec), with the radiation energy density of the flash lamp at 30 J/cm², after implanting ions with a boron dose of 1×10¹⁵ cm⁻² and accelerated energy of 150 keV. It can be seen from FIG. 19 that as the peak concentration exceeds 1×10¹⁹(cm⁻³) in both the collector layer and the side edge surface separation layer, they are activated. Although the peak concentration is of the same level as in the case of the laser annealing shown in FIG. 9, it is shown that the diffusion depth is slightly larger because a thermal diffusion effect due to the flash lamp is exerted. Also, in the fifth embodiment, no crystal defect is recognized in the lower layer of the collector surface or the inner side of the side edge surface separation layer. As a result, as shown in the fifth embodiment (FIG. 28D), the reverse direction current (reverse leakage current) is smaller than with the laser annealing of the comparison example shown in FIG. 28A. This indicates that, as the crystal defects formed accompanying the implantation of ions into the side edge surface separation layer are sufficiently restored, the leakage current when reverse biasing has become smaller, and the activation, that is, the restoration of the crystal defects, with the flash lamp annealing of the fifth embodiment is effective. It is also indicated that by bringing the center of the focal point at a time of a flash lamp annealing to a position from the upper portion to the central portion of the separation layer side end surface, it is possible to effectively restore the crystal defects from the upper portion to the central portion. Furthermore, it is also possible to carry out the flash lamp annealing for forming the collector layer and that for the side edge surface separation layer separately.

Sixth Embodiment

Figure 20:
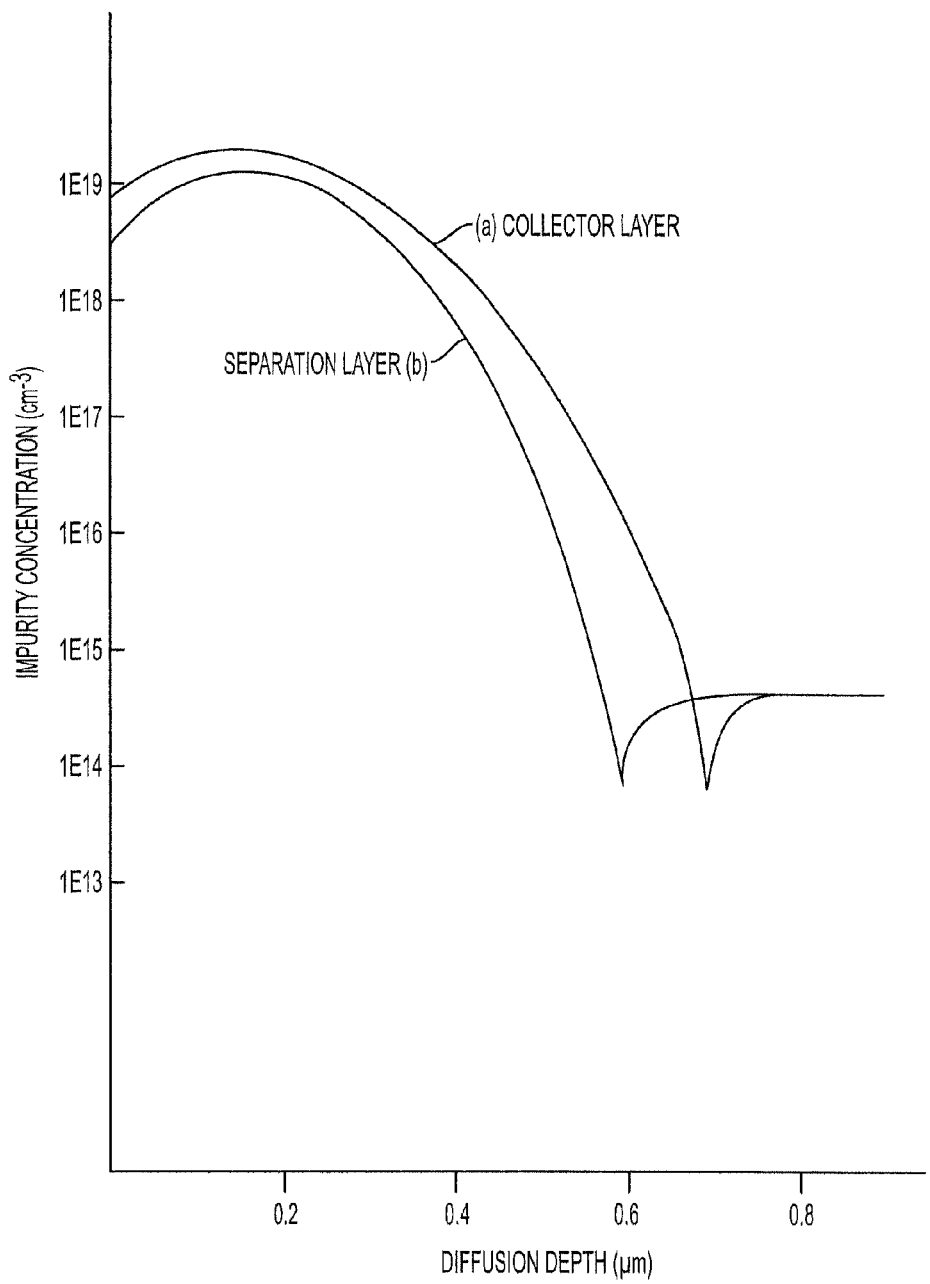
FIG. 20 is an impurity concentration profile diagram when increasing the energy of a collector surface laser irradiation to an extent at which a silicon surface is not destroyed, according to a sixth embodiment of the invention.
Figure 21:
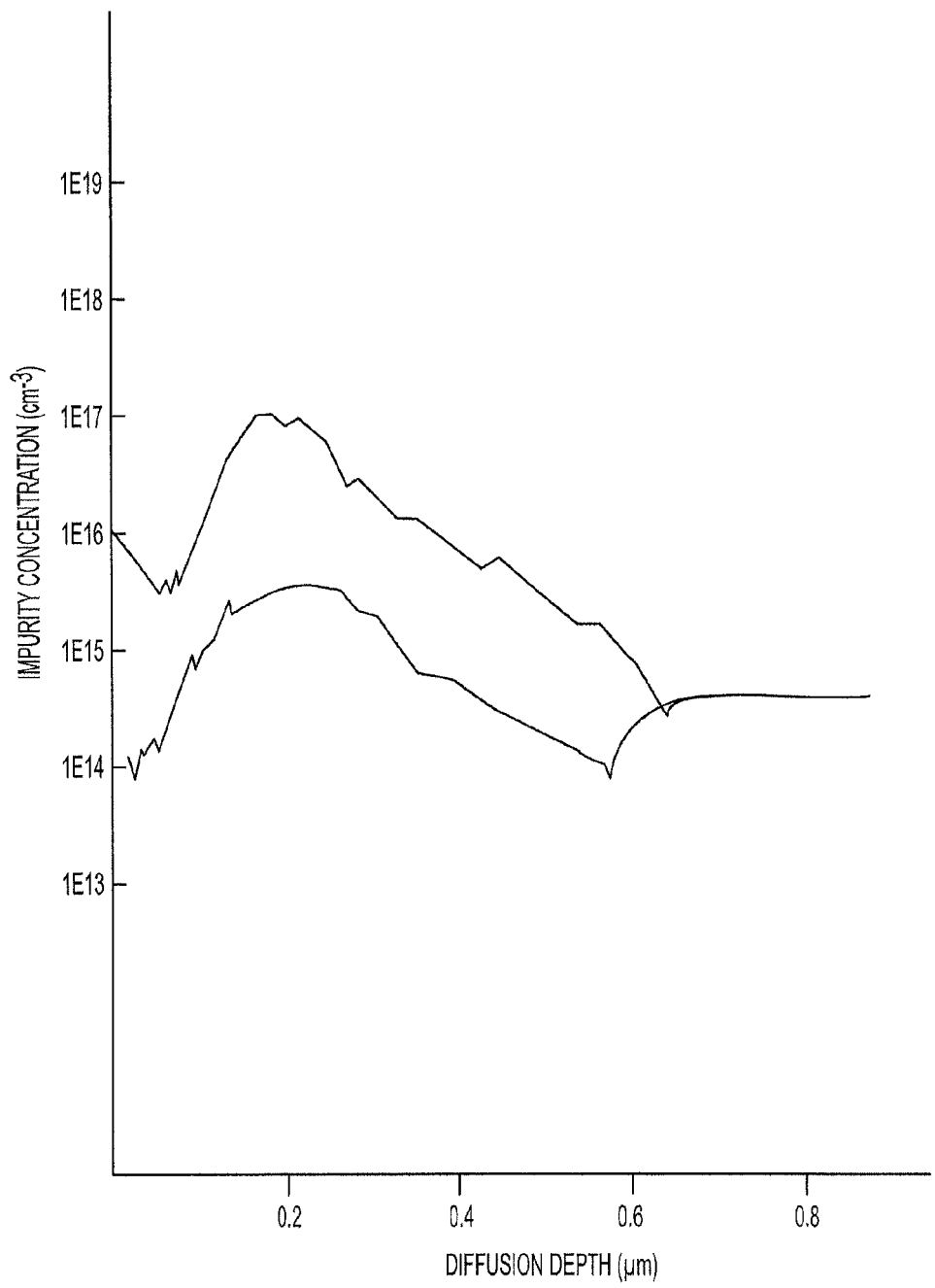
FIG. 21 is an impurity concentration profile diagram when a collector layer into which boron ions have been implanted is thermally destroyed by the laser irradiation.

In a sixth embodiment relating to the invention, laser annealing is used in the activation of the boron ion implantation layers of the collector layer and side edge surface separation layer. FIG. 20 is an impurity concentration profile diagram of a rear surface p-type collector layer a and a side edge surface separation layer b obtained from an SR measurement when activating using a YAG2ω laser (wavelength 532 nm, pulse width 100 ns), with the radiation energy density of the laser annealing at 3.8 J/cm$^2$, after implanting ions with a boron dose of $1\times10^{15}$ cm$^{-2}$ and accelerated energy of 150 keV. It can be seen from FIG. 20 that as the peak concentration exceeds $1\times10^{19}$(cm$^{-3}$) in both the collector layer and the side edge surface separation layer, they are activated. It is shown that the peak concentration is slightly higher than in the case of the laser annealing of the comparison example illustrated in FIG. 9, and that the diffusion depth is slightly larger because there is a diffusion effect. With the radiation energy density of the laser annealing at 3.8 J/cm$^2$, the collector surface (laser irradiated surface) side boron layer is not destroyed by heat. The thinking behind determining the radiation energy density of the laser annealing of the sixth embodiment is that by irradiating with the radiation energy density raised to an extent at which the rear surface collector surface ion implantation layer is not destroyed by the laser irradiation, it is possible to most efficiently activate the side edge surfaces, and effectively restore the crystal defects. This point differs from the laser annealing described in the third and fourth embodiments. If the radiation energy density of the laser annealing is too high, and the semiconductor crystal is destroyed (exceeds a solid-phase fusion condition, and melts away), the collector surface boron layer would not be formed, as shown in the impurity concentration profile diagram of FIG. 21.

No crystal defect is recognized in the lower layer of the collector surface or inner side of the side edge surface separation layer activated by the laser annealing of the sixth embodiment. In other words, this indicates that, unlike in the previously known example (FIG. 10B), all of the crystal defects in the inner side portion of the side edge surface separation layer are restored. As the laser radiation energy density is greater than in the case of the third embodiment, the crystal defect restoration effect is also greater. The reverse direction current (reverse leakage current) in the sixth embodiment (FIG. 28E) is smaller than in the laser annealing comparison example of FIG. 28A. This indicates that, as the restoration of the crystal defects accompanying the implantation of ions into the side edge surface separation layer was effective, as previously described, the leakage current when reverse biasing has become considerably smaller.

Seventh Embodiment

In a seventh embodiment relating to the invention, flash lamp annealing is used in the activation of the boron ion implantation layers of the collector layer and side edge surface separation layer.

Figure 22:
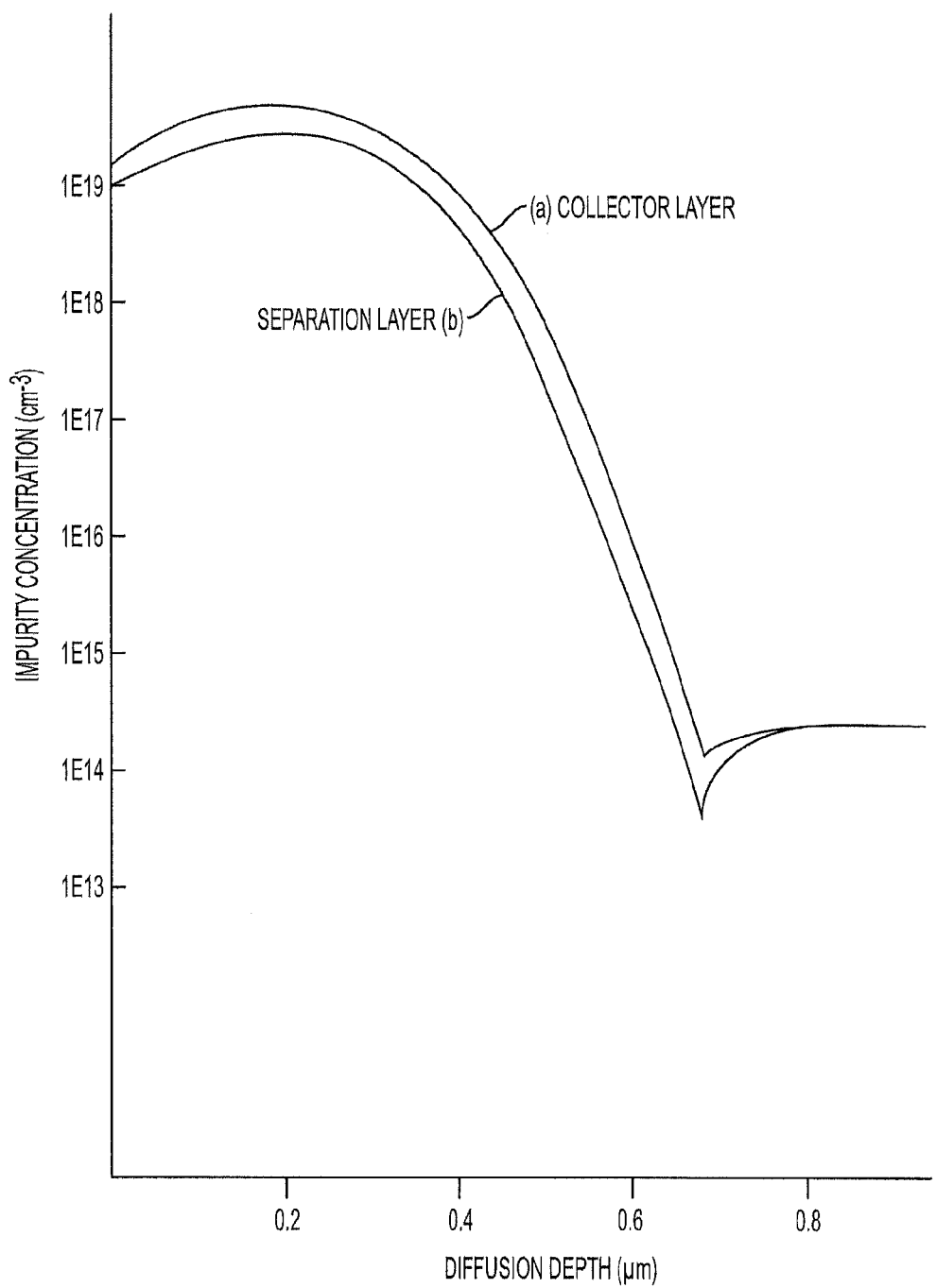
FIG. 22 is an impurity concentration profile diagram when increasing the energy of a collector surface flash lamp irradiation to an extent at which the silicon surface is not destroyed, according to a seventh embodiment of the invention.

FIG. 22 is an impurity concentration profile diagram of a collector layer a and a side edge surface separation layer b obtained from an SR measurement when using a flash lamp annealing (pulse width 1 msec), with the radiation energy density of the flash lamp at 32 J/cm$^2$, after implanting ions with a boron dose of $1\times10^{15}$ cm$^{-2}$ and accelerated energy of 150 keV. It can be seen from FIG. 22 that as the peak concentration exceeds $1\times10^{19}$(cm$^{-3}$) in both the collector layer and the side edge surface separation layer, they are activated. It is shown that the peak concentration is slightly higher because the energy density is higher, and the diffusion depth is slightly larger than in the case of FIG. 14 of the fifth embodiment. With the 32 J/cm$^2$, the collector surface (flash lamp irradiated surface) side boron layer is not destroyed by heat. The thinking behind determining the flash lamp radiation energy density of the flash lamp annealing of the seventh embodiment is that by irradiating with the flash lamp radiation energy density raised to an extent at which the rear surface collector surface ion implantation layer is not destroyed by the flash lamp annealing, it is possible to most efficiently activate the side edge surfaces, and effectively restore the crystal defects. This point differs from the flash lamp annealing described in the first, second, and fifth embodiments. If that the semiconductor crystal is destroyed (exceeds a solid-phase fusion condition, and melts away), no boron layer is formed in the collector surface, in the same way as in the impurity concentration profile of FIG. 21. Also, no crystal defect is recognized in the lower layer of the collector surface or the inner side of the side edge surface separation layer. Consequently, the reverse direction current (reverse leakage current) of the seventh embodiment (FIG. 28F) is smaller than in the laser annealing comparison example of FIG. 28A. Also, as all of the crystal defects accompanying the implantation of ions into the side edge surface separation layer are restored, the leakage current when reverse biasing has become smaller. That is, this means that the use of the flash lamp annealing of the seventh embodiment is effective.

Eighth Embodiment

In an eighth embodiment relating to the invention, laser annealing is used in the activation of the boron ion implantation layers of the collector layer and side edge surface separation layer.

Figure 23:
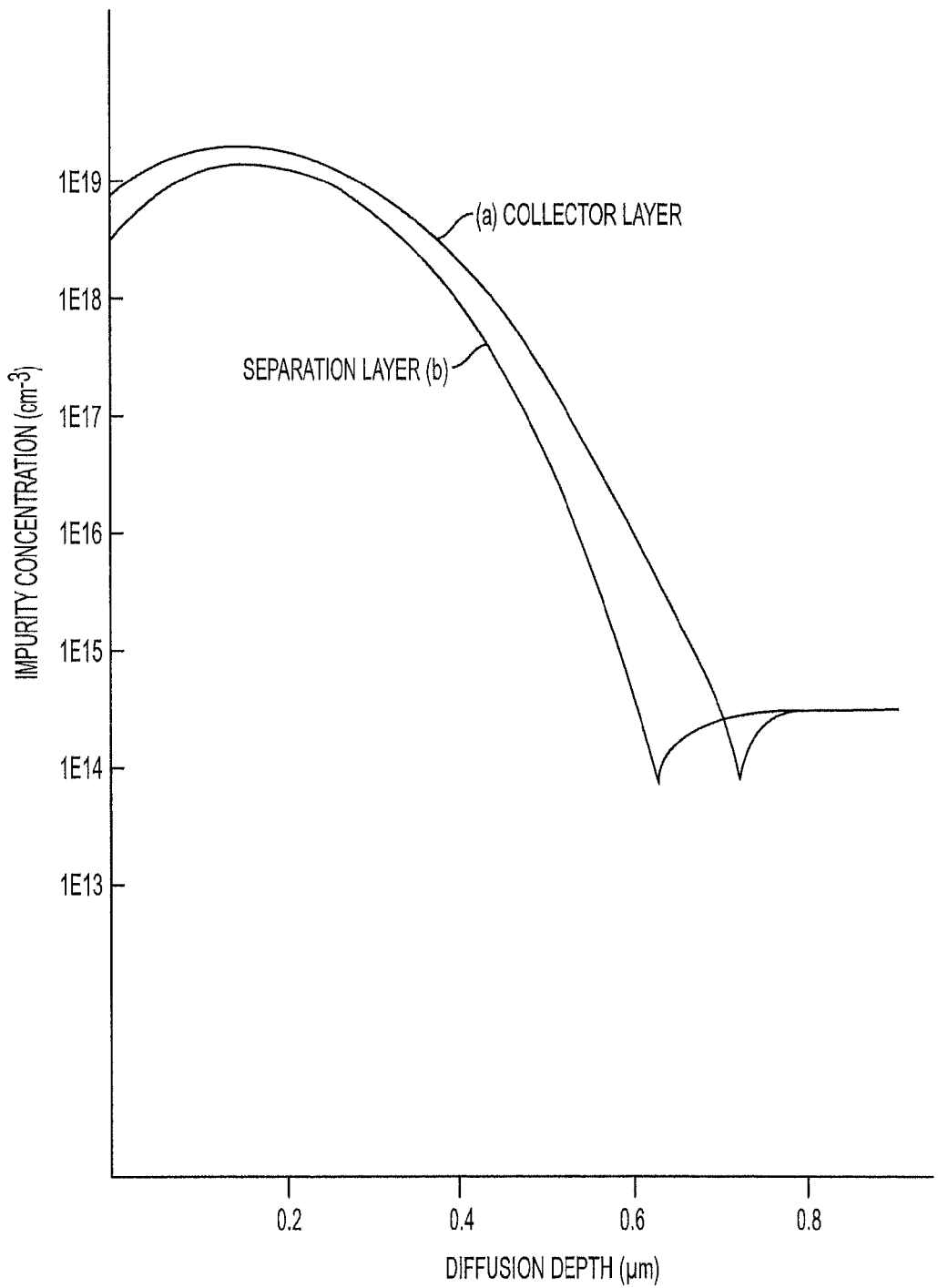
FIG. 23 is an impurity concentration profile diagram when scanning while overlapping pulsed laser irradiations, according to an eighth embodiment of the invention.

FIG. 23 is an impurity concentration profile diagram of a collector layer a and a side edge surface separation layer b obtained from an SR measurement when using a YAG2ω laser (wavelength 532 nm, pulse width 100 ns), with the radiation energy density of the laser annealing at 3.6 J/cm$^2$, and an irradiated region overlap rate in the laser scanning direction of 67%, after implanting ions with a boron dose of $1\times10^{15}$ cm$^{-2}$ and accelerated energy of 150 keV. The overlap rate of the laser irradiation light is characteristic of the laser annealing of the eighth embodiment, and is a process carried out in order to efficiently achieve the activation of the ion implantation region and the restoration of the crystal defects without raising the original laser irradiation device radiation energy density too far.

Figure 24A:
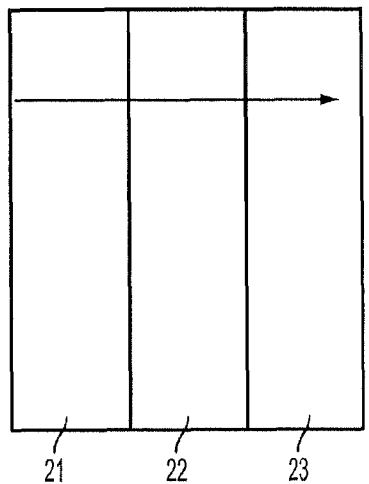
FIGS. 24A to 24D are illustrations of an overlap rate at a time of a laser irradiation according to the eighth embodiment of the invention.
Figure 24B:
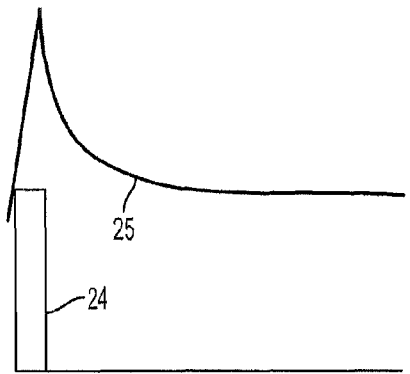
Figure 24C:
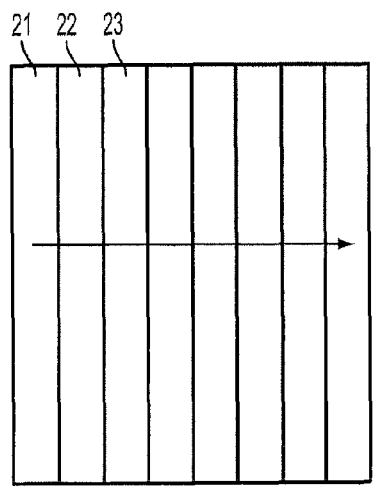
Figure 24D:
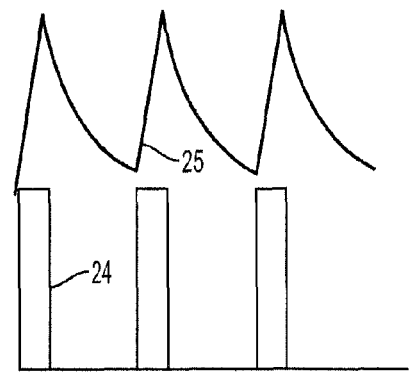

FIGS. 24A to 24D are illustrations of the laser irradiation light overlap rate. FIG. 24A shows three pulsed laser irradiation regions 21, 22, and 23 irradiated by one each of three pulsed lasers in such a way as not to overlap in the laser irradiation scanning direction shown by the arrow, and FIG. 24B shows a rectangular pulse current waveform 24 that generates a pulsed laser, and a temperature profile 25 of the pulsed laser. FIG. 24C shows a condition wherein an irradiation is carried out in such a way that the next pulsed laser irradiation regions 22 and 23 overlap the pulsed laser irradiation region 21 of FIG. 24A while their widths are displaced by one-third each. FIG. 24D shows the rectangular pulse current waveform 24 for generating the pulsed laser, and the temperature profile 25 of the pulsed lasers radiated onto the pulsed laser irradiation region 21 of FIG. 24A with their widths displaced by one-third each. In FIGS. 24C and 24D, there being an overlap of the laser irradiation regions, it is possible to cause the Si wafer to effectively absorb heat when irradiated because the next pulse enters before the temperature rise due to the laser irradiation is completely annulled. In FIGS. 24C and 24D, as laser irradiation regions overlap in two-thirds of the pulsed laser region 21, it is easy to cause the temperature of the irradiated regions to rise, even without increasing the radiation energy density of an individual pulsed laser. As a result of this, it is possible to efficiently restore the crystal defects even without using the kind of high radiation energy density that will cause the wafer to melt.

It can be seen from FIG. 23 that as the peak concentration exceeds $1\times10^{19}(cm^{-3})$ in both the collector layer and the side edge surface separation layer, they are activated. It is shown that the peak concentration is slightly higher than in the laser annealing previously known example shown in FIG. 9, and the diffusion depth is slightly larger because there is a thermal diffusion effect. In particular, by increasing the laser irradiation overlap rate, the diffusion depth in the bottom portion of the impurity concentration profile becomes large. With the 3.6 J/cm$^2$, the collector surface (laser irradiated surface) side boron layer is not destroyed by heat. Also, no crystal defect is recognized in the lower layer of the collector surface or the inner side of the side edge surface separation layer. Consequently, the reverse direction current (reverse leakage current) of FIG. 28G is smaller than in the laser annealing comparison example (FIG. 28A) and the fourth embodiment (FIG. 28C). Also, this means that, as all of the crystal defects accompanying the implantation of ions into the side edge surface separation layer are restored, the leakage current when reverse biasing decreases sufficiently. Consequently, it is possible to confirm the effectiveness of the laser irradiation provided with an overlap rate, as previously described. Also, furthermore, although a description has been given here of an overlap rate in the scanning direction, an overlap rate in a direction perpendicular to the scanning direction may also be increased. It is also effective to increase an overlap rate in both the scanning direction and a direction perpendicular thereto, provided that the collector surface (laser irradiated surface) side boron layer is not destroyed by heat.

It is preferable that the pulsed laser used in embodiments of the invention has a wavelength of 300 nm to 900 nm. The reason for making the wavelength range of each pulsed laser 300 nm to 900 nm is that if the wavelength is less than 300 nm, it is not possible to activate a deep region of an FZ-nSi substrate because the length of penetration into the silicon is 0.1 μm or less, and if the wavelength is more than 900 nm, the length of penetration also increases, passing almost completely through a desired thickness of p-type impurity layer and n-type impurity layer, and the annealing is inefficient. However, as the pulsed laser wavelength range in practical use goes up to no more than 700 nm, a more preferable range is 300 nm to 700 nm.

By setting the radiation energy density of one pulse of a laser beam emitted from a laser emitting device at a predetermined value (for example, 2.0 J/cm$^2$), the temperature of a place irradiated by the one pulse rises. After one region (for example, one point) is irradiated with one pulse of a laser beam, by carrying out a scanning irradiation overlapping with the next pulse before the heat provided by the first pulse is completely released, the temperature rise caused by the next one pulse is added to the temperature of the place where the heat release has not been completed. By so doing, after a plurality of pulse irradiations, the peak value of the temperature is saturated. The higher the saturated peak temperature, the higher the activation rate. According to this kind of laser irradiation method, by having one region repeatedly irradiated with a plurality of pulses, it is possible to sufficiently activate continuous p-n layers with a radiation energy density lower than that of a single pulse irradiation. This is the thinking behind overlapping the laser irradiations according to the eighth embodiment. Also, by keeping the radiation energy density of each pulse low, it is possible to keep the possibility of a radiation mark appearing on the wafer extremely low. The eighth embodiment is also effective when the restoration of the crystal defects after the ion implantation is also difficult using the method of the sixth embodiment.

Ninth Embodiment

Figure 25:
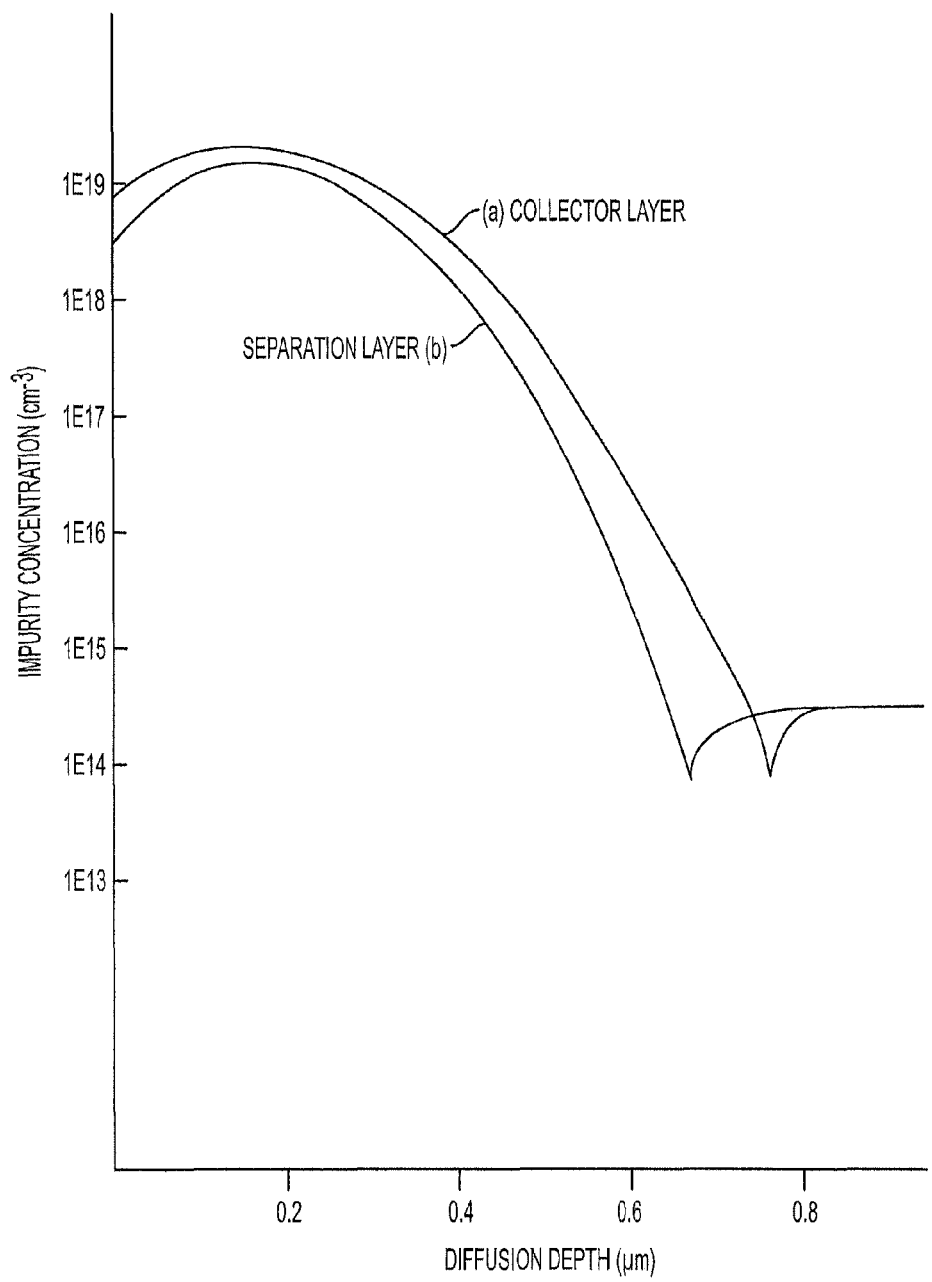
FIG. 25 is an impurity concentration profile diagram when combining the wafer substrate heating and the laser irradiation, according to a ninth embodiment of the invention.

In a ninth embodiment relating to the invention, laser annealing is used in the activation of the ion implantation layers of the collector layer and side edge surface separation layer. FIG. 25 is an impurity concentration profile diagram of a collector layer a and a side edge surface separation layer b obtained from an SR measurement using a YAG2ω laser (wavelength 532 nm, pulse width 100 ns), with the radiation energy density of the laser annealing at 3.6 J/cm$^2$, after implanting ions with a boron dose of $1\times10^{15}$ cm$^{-2}$ and accelerated energy of 150 keV, and making the wafer substrate temperature 400° C. (=a constant) before carrying out the laser irradiation. As it is necessary that the substrate temperature is such that the Al electrode already formed on the front surface side does not melt, it is necessary to keep it at 500° C. or lower. By keeping the rise of the substrate temperature to 500° C. or lower in this way, not only the heat of the laser irradiation, but also a heat storage effect arising from the substrate temperature acts effectively in the restoration of the crystal defects, and it is possible to activate efficiently.

It can be seen from FIG. 25 that as the peak concentration exceeds $1\times10^{19}(cm^{-3})$ in both the collector layer and the side edge surface separation layer, they are activated. Although the peak concentration is of the same level as in the case of the laser annealing of the comparison example of FIG. 9, the diffusion depth is larger than in the third embodiment (FIG. 14) because there is a thermal diffusion effect. Also, no crystal defect is recognized in the lower layer of the collector surface or the inner side of the side edge surface separation layer. Because of this, the reverse direction current (reverse leakage current) (FIG. 28H) is smaller than in the cases of the laser annealing of the comparison example shown in FIG. 28A and the fourth embodiment (FIG. 28C). Also, this indicates that, as all crystal defects accompanying the implantation of ions into the side edge surface separation layer are restored (furthermore, the thermal diffusion effect due to the heating by the substrate temperature is greater than in the case of the third embodiment), the leakage current when reverse biasing has become smaller.

Tenth Embodiment

In a tenth embodiment relating to the invention, a flash lamp annealing is used in the activation of the ion implantation layers of the collector layer and side edge surface separation layer.

Figure 26:
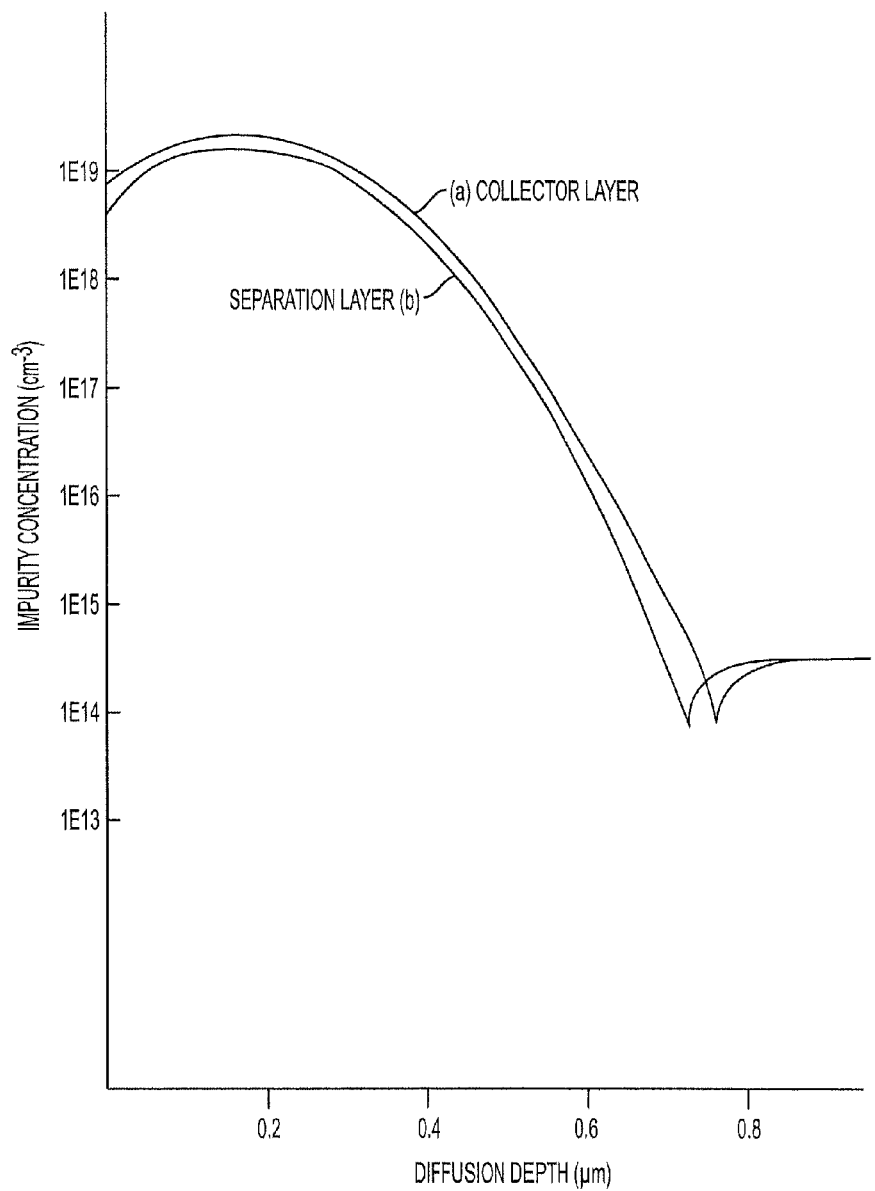
FIG. 26 is an impurity concentration profile diagram when combining the wafer substrate heating and the flash lamp irradiation, according to a tenth embodiment of the invention.

FIG. 26 is an impurity concentration profile diagram of a collector layer a and a side edge surface separation layer b obtained from an SR measurement, wherein the wafer substrate temperature is maintained at 400° C. (=a constant) before carrying out the flash lamp annealing, after which flash lamp annealing (pulse width 1 msec) is used with the flash energy density at 30 J/cm$^2$. As it is necessary that the substrate has a temperature such that the Al electrode already formed on the front surface side does not melt, it is necessary that it is kept to 500° C. or lower. As the wafer substrate temperature is raised to and maintained at 400° C. before the flash lamp irradiation, the heat of the flash lamp irradiation acts effectively, a heat storage effect arising from the heating acts also effectively, it becomes possible to efficiently activate the side edge surfaces, and the effect is such as to effectively restore the crystal defects. It can be seen from FIG. 26 that as the peak concentration exceeds $1\times10^{19}(cm^{-3})$ in both the collector layer and the side edge surface separation layer, they are activated. Although the peak concentration is of the same level as in the case of the seventh embodiment (FIG. 22), the diffusion depth is slightly larger than in the case of the sixth embodiment (FIG. 20). With the flash energy density at 30 J/cm², the collector surface (flash lamp irradiated surface) side boron layer is not destroyed by heat. If the collector surface is destroyed (exceeds a solid-phase fusion condition, and melts away), no boron layer is formed in the collector surface, and no crystal defect is recognized in the lower layer of the collector surface or the inner side of the side edge surface separation layer. As a result of this, the reverse direction current (reverse leakage current) of the tenth embodiment, as shown in FIG. 28I, is smaller than in the laser annealing comparison example of FIG. 28A. Also, this means that, as all of the crystal defects accompanying the implantation of ions into the side edge surface separation layer are restored, the leakage current when reverse biasing has become smaller. From the above description, it can be understood that utilizing the wafer heating and using the flash lamp annealing are effective with respect to a structure having a separation layer in the side edge surfaces.

Herein, although a description has been given of an n-type reverse block-type IGBT wherein boron ions are caused to diffuse in the separation layer, it is also possible to use aluminum as p-type impurity ions. Also, it is possible to fabricate by using phosphorus ions for a separation layer dopant in a p-type reverse block-type IGBT.

Also, a flash lamp annealing using a xenon lamp is preferable, but there is no problem with using a lamp annealing using an infrared lamp or halogen lamp, provided that a flash lamp radiation energy density with a pulse width of a few milliseconds and the high energy density necessary for activation can be obtained. 20 J/cm² to 40 J/cm² is preferable as the flash lamp radiation energy density in this case.

According to the tenth embodiment, with a reverse block-type IGBT wherein side edge surfaces are formed using an anisotropic etching, and a separation layer is formed by carrying out an implantation of ions into the side edge surfaces and annealing, there are formed a collector layer and separation layer with no ion implantation crystal defect caused by the ion implantation in the p-n junction region, it is possible to suppress the leakage current when reverse biasing, and it is possible to provide a reverse block-type IGBT exhibiting a stable yield rate.

Although a few embodiments have been shown and described, it would be appreciated by those skilled in the art that changes may be made in these embodiments without departing from the principles and spirit of the invention, the scope of which is defined in the claims and their equivalents.

What is claimed is:

1. A reverse block-type insulated gate bipolar transistor manufacturing method, comprising:
    forming a MOS gate structure on one main surface of a first conductivity type semiconductor substrate;
    forming a second conductivity type collector layer on an other main surface;
    forming a second conductivity type separation layer, along a tapered side edge surface formed by etching from either one of the main surfaces to the other main surface, that links the two main surfaces with a layer of the same conductivity type, and is connected to the second conductivity type collector layer of the other main surface; and
    forming each of an emitter metal electrode on the MOS gate structure side and a collector metal electrode on the second conductivity type collector layer side,
    wherein when irradiating with a flash lamp for a flash lamp annealing after an implantation of ions into the second conductivity type separation layer and second conductivity type collector layer to form the second conductivity type collector layer and second conductivity type separation layer, the strongest portion of the radiation energy is focused on a depth position from the upper portion to the central portion of the tapered side edge surface.

2. The reverse block-type insulated gate bipolar transistor manufacturing method according to claim 1,
    wherein the flash lamp radiation energy density for the flash lamp annealing is a high density of an extent at which the second conductivity type collector layer is not thermally destroyed.

3. The reverse block-type insulated gate bipolar transistor manufacturing method according to claim 1,
    wherein the flash lamp annealing is carried out separately for the second conductivity type separation layer and second conductivity type collector layer.

4. The reverse block-type insulated gate bipolar transistor manufacturing method according to claim 1,
    wherein the flash lamp annealing is carried out while a holding temperature of the semiconductor substrate is maintained at a high temperature equal to or lower than the melting temperature of the emitter metal electrode.

5. The reverse block-type insulated gate bipolar transistor manufacturing method according to claim 4,
    wherein the emitter metal electrode is a metal electrode film with aluminum as a main element.

6. The reverse block-type insulated gate bipolar transistor manufacturing method according to claim 5,
    wherein the holding temperature of the semiconductor substrate is a high temperature of 500° C. or less.

7. The reverse block-type insulated gate bipolar transistor manufacturing method according to claim 1,
    wherein the light source of the flash lamp annealing is a xenon lamp having an energy density of 20 J/cm² to 40 J/cm² every few milliseconds.

8. The reverse block-type insulated gate bipolar transistor manufacturing method according to claim 1,
    wherein the light source of the flash lamp annealing is an infrared lamp or halogen lamp having an energy density of 20 J/cm² to 40 J/cm².

* * * * *